(12) United States Patent
Kim et al.

(10) Patent No.: US 11,798,963 B2
(45) Date of Patent: Oct. 24, 2023

(54) IMAGE SENSOR

(71) Applicant: Samsung Electronics Co., Ltd., Suwon-si (KR)

(72) Inventors: Yunhong Kim, Hwaseong-si (KR); Yunhwan Jung, Hwaseong-si (KR); Heesung Chae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 398 days.

(21) Appl. No.: 17/119,330

(22) Filed: Dec. 11, 2020

(65) Prior Publication Data
US 2021/0335869 A1  Oct. 28, 2021

(30) Foreign Application Priority Data
Apr. 28, 2020 (KR) .................. 10-2020-0051380

(51) Int. Cl.
*H01L 27/146* (2006.01)
*H04N 25/75* (2023.01)

(52) U.S. Cl.
CPC .. *H01L 27/14612* (2013.01); *H01L 27/14636* (2013.01); *H01L 27/14643* (2013.01); *H04N 25/75* (2023.01)

(58) Field of Classification Search
CPC ......... H01L 27/14612; H01L 27/14636; H01L 27/14643; H01L 27/14621; H04N 25/75; H04N 25/617; H04N 25/616; H04N 25/70; H04N 25/60; H04N 25/7013
USPC ........................................... 348/294
See application file for complete search history.

(56) References Cited

U.S. PATENT DOCUMENTS

| | | | |
|---|---|---|---|
| 9,462,199 B2 | 10/2016 | Kim et al. | |
| 10,161,789 B2 | 12/2018 | Suh et al. | |
| 10,199,411 B2 | 2/2019 | Ohmaru | |
| 10,388,364 B2* | 8/2019 | Ishizu | H01L 29/7869 |
| 10,522,084 B2 | 12/2019 | Zhang et al. | |
| 2008/0055432 A1* | 3/2008 | Koseki | H04N 25/677 |
| | | | 348/E5.079 |
| 2019/0154850 A1 | 5/2019 | Nishihara et al. | |
| 2020/0053300 A1* | 2/2020 | Tseng | H04N 25/75 |

FOREIGN PATENT DOCUMENTS

KR   100823173  *  4/2008  .......... H04N 23/616

* cited by examiner

*Primary Examiner* — Lin Ye
*Assistant Examiner* — Chan T Nguyen
(74) *Attorney, Agent, or Firm* — Harness, Dickey & Pierce, P.L.C.

(57) ABSTRACT

An image sensor includes a substrate including an active pixel region and an inactive pixel region, having a smaller area than the active pixel region; a plurality of active pixels in the active pixel region, each of the plurality of active pixels including a first transfer transistor, a first reset transistor, a first driving transistor, and a first selection transistor; and a plurality of inactive pixels in the inactive pixel region, each of the plurality of inactive pixels including a second transfer transistor, a second reset transistor, a second driving transistor, a second selection transistor, and a switch transistor connected to a node between the second driving transistor and the second select transistor. The plurality of switch transistors, included in the plurality of inactive pixels, are connected to each other by a connection wiring.

20 Claims, 23 Drawing Sheets

IMAGE SENSOR

CROSS-REFERENCE TO RELATED APPLICATION(S)

This application claims benefit of priority to Korean Patent Application No. 10-2020-0051380 filed on Apr. 28, 2020 in the Korean Intellectual Property Office, the disclosure of which is incorporated herein by reference in its entirety.

BACKGROUND

The present disclosure relates to an image sensor.

An image sensor is a semiconductor-based sensor receiving light to generate an electrical signal, and may include a pixel array having a plurality of pixels, logic circuits for driving the pixel array and generating an image, and/or the like. The logic circuit may obtain a pixel signal from the pixels to generate image data. Recently, as the number of pixels included in an image sensor has been increased and an area of a single pixel has been decreased, various efforts have been made to improve noise characteristics of pixel signals.

SUMMARY

Example embodiments provide an image sensor which may (potentially) significantly reduce output voltage fluctuation of pixels by obtaining a reset voltage from the pixels and then connecting column lines, connected to the pixels, to each other.

According to some example embodiments, an image sensor includes a substrate including an active pixel region and an inactive pixel region, having a smaller area than the active pixel region; a plurality of active pixels in the active pixel region, each of the plurality of active pixels including a first transfer transistor, a first reset transistor, a first driving transistor, and a first selection transistor; and a plurality of inactive pixels in the inactive pixel region, each of the plurality of inactive pixels including a second transfer transistor, a second reset transistor, a second driving transistor, a second selection transistor, and a switch transistor connected to a node between the second driving transistor and the second select transistor. Each of the plurality of switch transistors, included in the the plurality of inactive pixels, are connected to each other by a connection wiring.

According to some example embodiments, an image sensor includes: a plurality of active pixels in a first direction and a second direction, intersecting the first direction, the plurality of active pixels including a first selection transistor connected to one column line, among a plurality of column lines extending in the second direction; a plurality of inactive pixels in the first direction, the plurality of inactive pixels including a second selection transistor connected to one of the column lines; a plurality of switch transistors, each of the plurality of switch transistors connected to the corresponding second selection transistor, included in each of the plurality of inactive pixels, and a connection wiring extending in the first direction; and a logic circuit configured to obtain pixel data output by the plurality of active pixels and to turn on the plurality of switch transistors while the second plurality of selection transistors are turned on.

According to some example embodiments, an image sensor includes: a plurality of pixels connected to a plurality of row lines, extending in a first direction, and a plurality of column lines extending a second direction, intersecting the first direction; and a logic circuit configured to obtain pixel data from the plurality of pixels. Each of the plurality of pixels includes a photoelectric element, a floating diffusion region in which charges generated by the photoelectric element are stored, a transfer transistor between the floating diffusion region and the photoelectric element, a driving transistor connected to the floating diffusion region, and a selection transistor connected between one of the column lines and the driving transistor. The logic circuit is configured to obtain a reset signal from selected pixels, among the plurality of pixels, during a first time, is configured to obtain a pixel signal from the selected pixels during a second time, subsequent to the first time, and is configured to electrically connect the plurality of column lines to each other and is configured to turn on the transfer transistor of each of the selected pixels during a transfer time between the first time and the second time.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
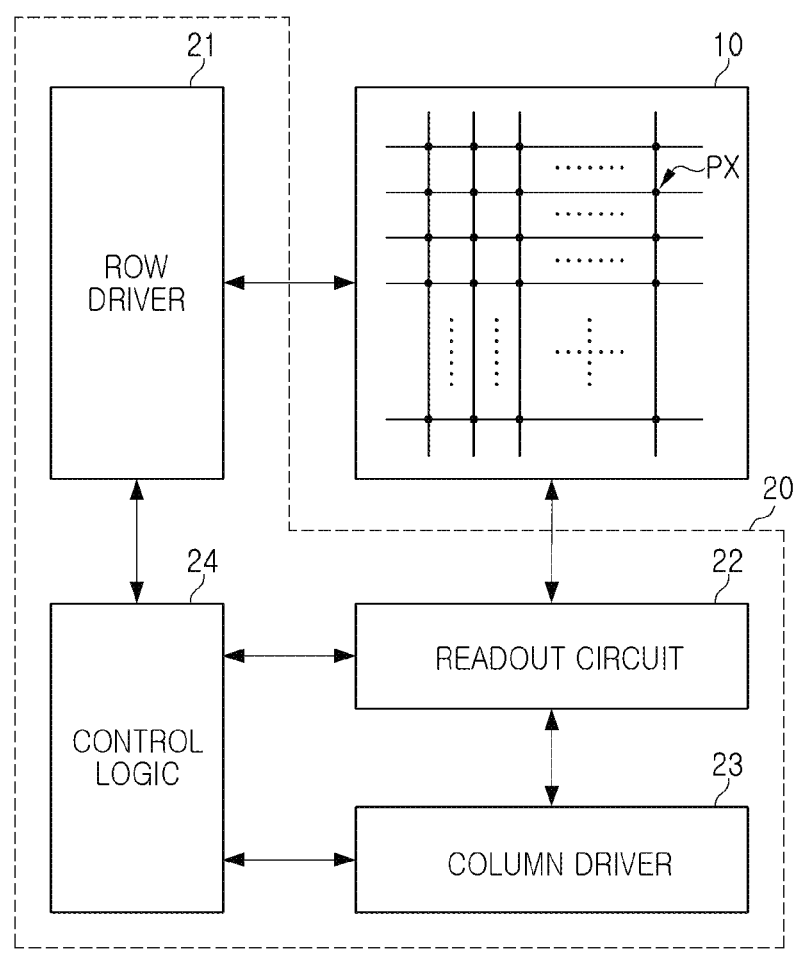
FIG. 1 is a schematic block diagram of an image sensor according to example embodiments.

FIG. 1 is a schematic block diagram of an image sensor according to example embodiments.

Referring to FIG. 1, an image sensor 1 may include a pixel array 10, a logic circuit 20, and/or the likeand/or the like.

The pixel array 10 may include a plurality of pixels PX arranged in an array form along a plurality of rows and a plurality of columns. Each of the plurality of pixels PX may include at least one photoelectric element generating charges in response to light, a pixel circuit generating a pixel signal corresponding to the charges generated by the photoelectric element, and/or the likeand/or the like. The photoelectric element may include a photodiode, formed of a semiconductor material, and/or an organic photodiode formed of an organic material.

As an example, the pixel circuit may include a floating diffusion region, a transfer transistor, a reset transistor, a driving transistor, a selection transistor, and/or the likeand/or the like. A configuration of the pixels PX may vary according to example embodiments. As an example, each of the pixels PX may include an organic photodiode including an organic material, or may be implemented as a digital pixel. When the pixels PX are implemented as digital pixels, each of the pixels PX may include an analog-to-digital converter for outputting a digital pixel signal.

The logic circuit 20 may include circuits for controlling the pixel array 10. As an example, the logic circuit 20 may include a row driver 21, a readout circuit 22, a column driver 23, a control logic 24, and/or the likeand/or the like. The row driver 21 may drive the pixel array 10 in units of row lines. For example, the row driver 21 generates a transfer control signal controlling the transfer transistor of the pixel circuit, a reset control signal controlling the reset transistor, a selection control signal controlling the selection transistor, and/or the likeand/or the like, and may input the generated signals to the pixel array 10 in units of row lines.

The readout circuit 22 may include a correlated double sampler (CDS), an analog-to-digital converter (ADC), and/or the likeand/or the like. The correlated double samplers may be connected to the pixels PX through column lines. The correlated double samplers may read a pixel signal from pixels PX, connected to a row line selected by the row line selection signal of the row driver 21, through the column lines. The analog-to-digital converter may convert a pixel signal, detected by the correlated double sampler, into a digital pixel signal and may transmit the digital pixel signal to the column driver 23.

The column driver 23 may include a latch or buffer circuit temporarily storing the digital pixel signal, an amplifier circuit, and/or the like, and may process the digital pixel signal received from the readout circuit 22. The row driver 21, the readout circuit 22 and the column driver 23 can be controlled by the control logic 24. The control logic 24 may include a timing controller for controlling operation timings of the row driver 21, the readout circuit 22, and the column driver 23.

Among the pixels PX, pixels PX disposed in the same position in a first direction (a horizontal direction) may share the same column line. As an example, pixels PX disposed in the same position in a second direction (a vertical direction) are simultaneously selected by the row driver 21 and may output a pixel signal through column lines. In some example embodiments, the readout circuit 22 may simultaneously obtain a pixel signal from the pixels PX selected by the row driver 21 through the column lines. The pixel signal may have a reset voltage and a pixel voltage, and the pixel voltage may be a voltage in which charges generated in response to light in each of the pixels PX are reflected in the reset voltage.

In some example embodiments, the readout circuit 22 may read the reset voltage and the pixel voltage in order from each of the pixels PX selected by the row driver 21. After the readout circuit 22 reads the reset voltage, the charges generated by the photoelectric element in each of the pixels PX may be transferred to the floating diffusion region. For example, a voltage on the column lines may fluctuate due to a switching operation, in which the charges of the photoelectric element are transferred to the floating diffusion region, or the like. The voltage on the column lines may not be maintained at the reset voltage.

In some example embodiments, voltage fluctuation of the column lines may be significantly reduced by connecting the column lines to each other while transferring the charge of the photoelectric element to the floating diffusion region. Therefore, noise characteristics of the image sensor 1 may be improved.

FIGS. 2 to 5 illustrate pixel arrays of image sensors according to example embodiments.

Figure 2:
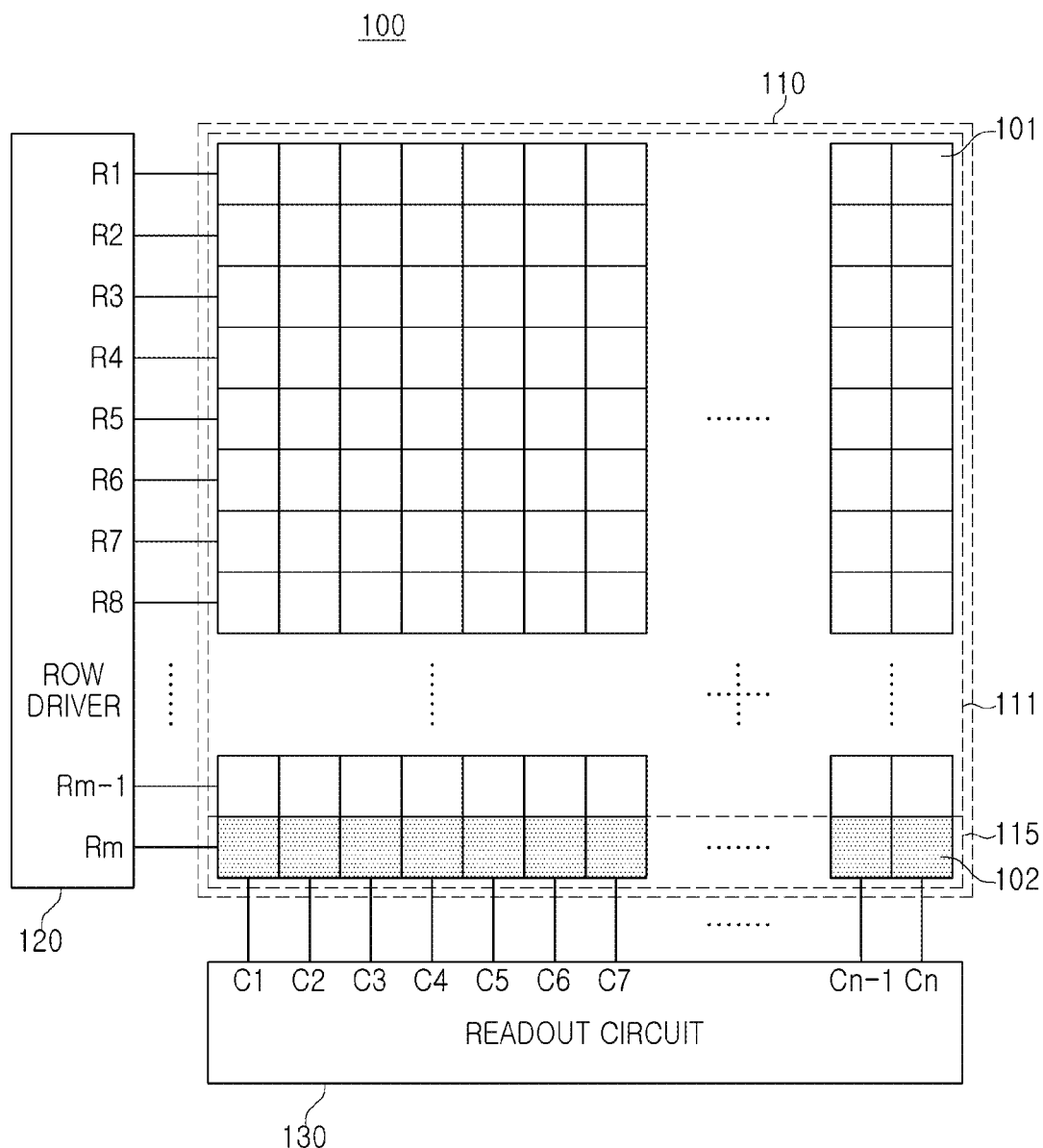
FIGS. 2 to 5 illustrate pixel arrays of image sensors according to example embodiments.

Referring to FIG. 2, an image sensor 100 may include a pixel array 110, a row driver 120, a readout circuit 130, and/or the like. The pixel array 110 may include a plurality of pixels 101 and 102, and may be connected to the row driver 120 through row lines R1 to Rm and connected to the readout circuit 130 through column lines C1 to Cn. Operations of the row driver 120 and the readout circuit 130 may be similar to those described with reference to FIG. 1.

The pixel array 110 may include an active pixel region 111, in which active pixels 101 are disposed, and an inactive pixel region 115 in which inactive pixels 102 are disposed. Each of the active pixels 101 and each of the inactive pixels 102 may have the same structure. As an example, each of the active pixels 101 and each of the inactive pixels 102 may include a photoelectric element, a transfer transistor, a driving transistor, and a selection transistor, and may include pixel circuits having the same structure and be formed by the same process.

In example embodiments illustrated in FIG. 2, the inactive pixels 102 may be disposed in a first direction (a horizontal direction), and disposed below the active pixel region 111 in the pixel array 110. Therefore, a width of the inactive pixel region 115 may be the same as a width of the active pixel region 111, in the first direction. The number of inactive pixels 102 may be less than the number of active pixels 101. As an example, the number of the active pixels 101 may be N times (where N is a positive integer) of the number of inactive pixels 102.

In some example embodiments, the inactive pixels 102 and/or the readout circuit 130 may include switch transistors connecting the column lines C1 to Cn to each other. The switch transistors may be connected to nodes on which the driving transistor and the selection transistor are connected to each other in the inactive pixels 102, or may be connected between the column lines C1 to Cn.

When the row driver 120 selects one of the row lines R1 to Rm-1 connected to the active pixel region 111, the readout circuit 130 may obtain a pixel signal from the active pixels 101 connected to the selected row line. The switch transistors may be turned on for a predetermined or alternatively, desired time, while the readout circuit 130 obtains a pixel signal, to electrically connect the column lines C1 to Cn to each other. As an example, the switch transistors may be turned on while the transfer transistor is turned on in the active pixels 101 connected to the selected row line, allowing fluctuation of a voltage on the column lines C1 to Cn to be significantly reduced.

Figure 3:
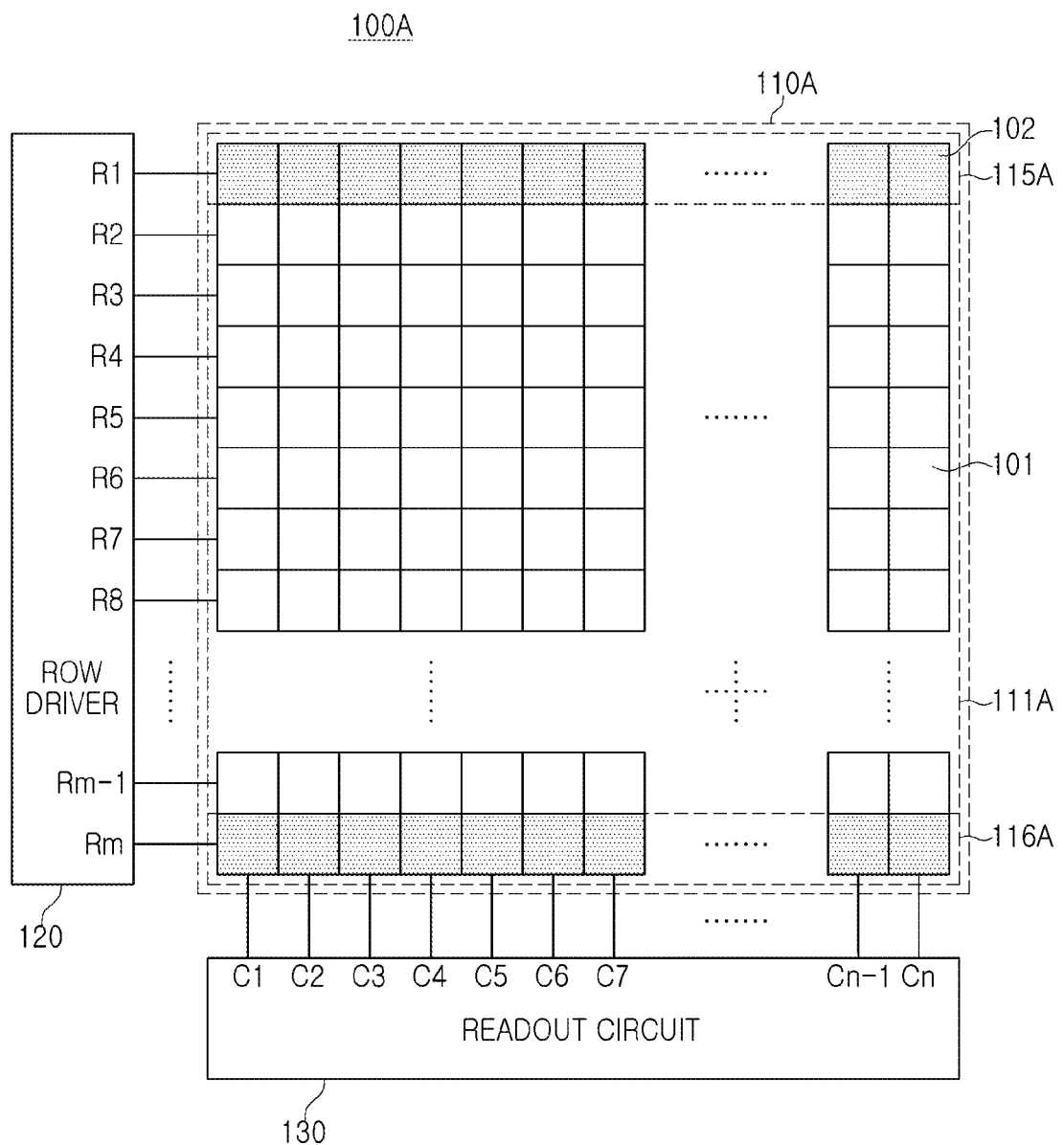

Referring to FIG. 3, an image sensor 100A may include a pixel array 110A, a row driver 120, a readout circuit 130, and/or the like. In example embodiments illustrated in FIG. 3, the pixel array 110A may include first inactive pixel region 115A and the second inactive pixel region 116A disposed on opposite sides, adjacent to an active pixel region 111A, in a second direction (a vertical direction). Referring to FIG. 3, the number of the inactive pixels 102, included in the first inactive pixel region 115A, and the number of the inactive pixels 102, included in the second inactive pixel region 116A, may be the same. The inactive pixels 102 may be adjacent to the active pixels 101 on one side in the second direction.

Each of the inactive pixels 102, included in the first inactive pixel region 115A, and the inactive pixels 102, included in the second inactive pixel region 116A, may include a switch transistor which may connect or separate column lines C1 to Cn to or from each other. In example embodiments illustrated in FIG. 3, when the row driver 120 selects one of the row lines R2 to Rm-1 connected to the active pixel region 111A, among the inactive pixel regions 115A and 116A, one pixel region close to the selected row line may be also selected. For example, when the second row line R2 is selected, the first inactive pixel region 115A may be selected. While a transfer transistor of the active pixels 101 connected to the second row line R2 is turned on, switch transistors included in the inactive pixels 102 of the first inactive pixels 115A may be turned on to electrically connect the column lines C1 to Cn to each other.

Alternatively, according to example embodiments, all of the inactive pixels 102 may be simultaneously selected irrespective of a location of a selected row line. For example, while the transfer transistor of the active pixels 101 selected by the row driver 120 is turned on, switch transistors included in the inactive pixels 102 of the first and second inactive pixel regions 115A and 116A may be turned on to electrically connect the column lines C1 to Cn to each other.

Figure 4:
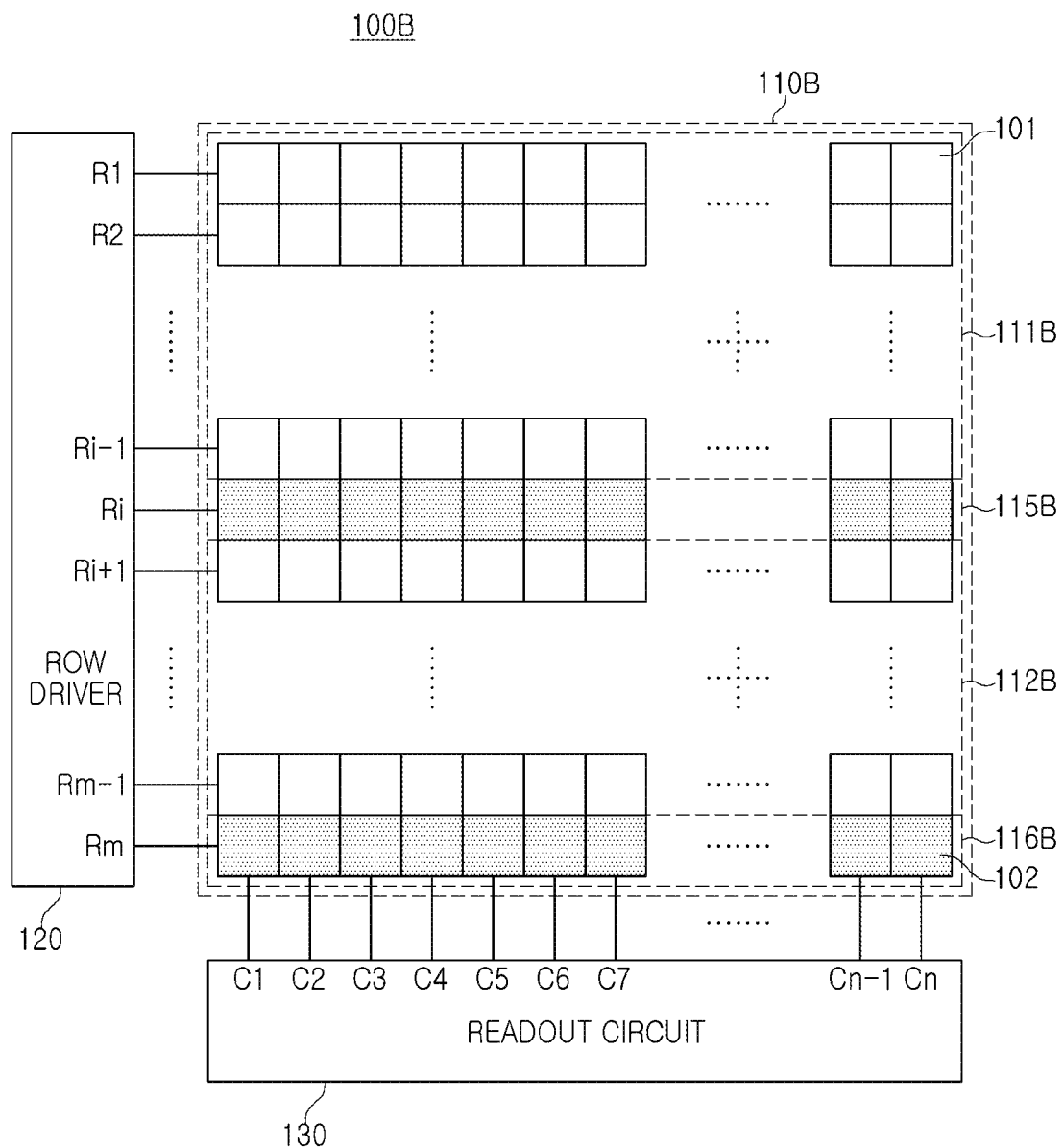

Referring to FIG. 4, an image sensor 100B may include a pixel array 110B, a row driver 120, a readout circuit 130, and/or the like. In example embodiments illustrated in FIG. 4, the pixel array 110B includes active pixel regions 111B and 112B and inactive pixel regions 115B and 116B. The active pixel regions 111B and 112B and the inactive pixel regions 115B and 116B may be alternately disposed in a second direction (a vertical direction). Accordingly, the inactive pixels 102 included in the first inactive pixel regions 115B may be adjacent to the active pixels 101 on opposite sides in the second direction.

An operation of the inactive pixels 102 may be similar to that described with reference to FIG. 3. In example embodiments, only one of the inactive pixel regions 115B and 116B may be selected during a time in which a pixel signal is selected from the active pixel 101 by the row driver 120. For example, the column lines C1 to Cn may be electrically connected to each other while switch transistors are turned on in the inactive pixels 102 included in a selected inactive pixel region among the inactive pixel regions 115B and 116B.

Also, in some example embodiments, all of the inactive pixel regions 115B and 116B may be selected during the time in which the pixel signal is selected from the active pixel 101 by the row driver 120. For example, the column lines C1 to Cn may be electrically connected to each other during a time in which the switch transistors is turned on in the inactive pixels 102 included in both the inactive pixel regions 115B and 116B.

Figure 5:
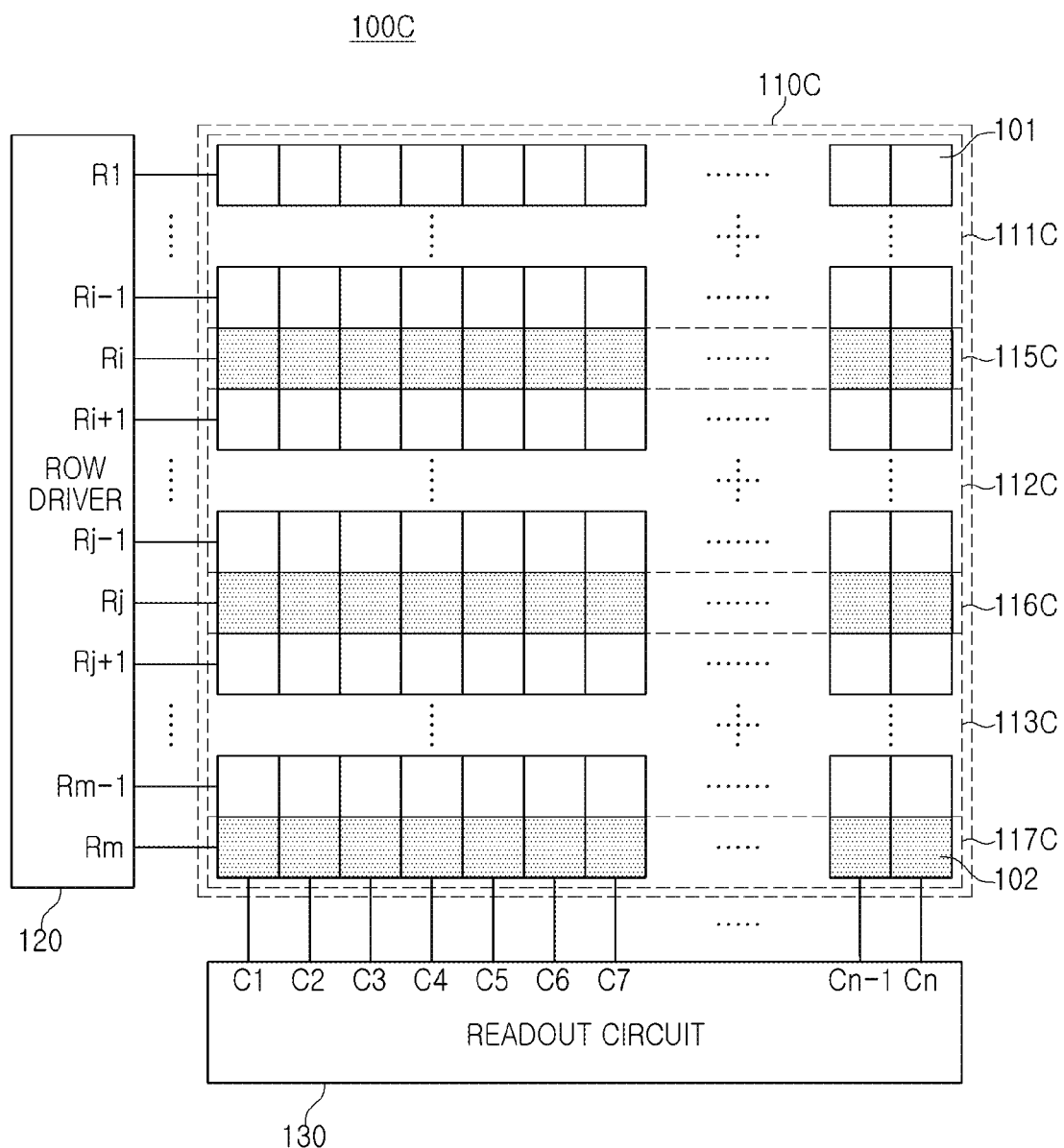

Referring to FIG. 5, an image sensor 100C may include a pixel array 110C, a row driver 120, a readout circuit 130, and/or the like. In example embodiments illustrated in FIG. 5, the pixel array 110C includes active pixel regions 111C to 113C and inactive pixel regions 115C to 117C. The active pixel regions 111C to 113C and the inactive pixel regions 115C to 117C may be alternately disposed in a second direction (a vertical direction). Accordingly, among the inactive pixels 102, at least a portion of inactive pixels may be adjacent to the active pixels 101 on opposite sides in the second direction. An operation of the inactive pixels 102 may be similar to that described with reference to FIGS. 3 and 4.

In example embodiments shown in FIGS. 2 to 5, the number of the active pixels 101 may be 100 to 5000 times the number of the inactive pixels 102. As an example, the number of inactive pixels 102 may be appropriately selected in consideration of the number of the active pixels 101 included in the image sensors 100, 100A, 100B, and 100C. The fluctuation of voltages on the column lines C1 to Cn may be effectively reduced or prevented in consideration of capacitors present in the column lines C1 to Cn by increasing the number of the inactive pixels 102 and simultaneously turning on the inactive pixels 102 disposed in different positions in the second direction. However, since the inactive pixels 102 do not output pixel data corresponding to light reflected from a subject, the quality of resultant images output by the image sensors 100, 100A, 100B, and 100C may be deteriorated when too many inactive pixels 102 are disposed. In view of the foregoing, the number of the active pixels 101 and the number of the inactive pixels 102 may be appropriately selected.

In addition, unlike example embodiments illustrated in FIGS. 2 to 5, two or more inactive pixels 102 may be continuously disposed in a second direction (a vertical direction) in which column lines extend in a pixel array. As an example, in a modification of example embodiments illustrated in FIG. 5, at least a portion of inactive pixel regions, among the inactive pixel regions 115C to 117C, may be continuously disposed adjacent to each other in the second direction.

In example embodiments illustrated in FIGS. 3 to 5 in which two or more inactive pixel regions are disposed, at least one of the inactive pixel regions may operate as active pixel regions. For example, in example embodiments illustrated in FIG. 4, the i-th row line R1, in which the row driver 120 is connected to the first inactive pixel region 115B, is selected and the readout circuit 130 may obtain pixel data from the inactive pixels 102 included in the first inactive pixel region 115B through the column lines C1 to Cn. While the transfer transistor of the inactive pixels 102 included in the first inactive pixel region 115B is turned on by the row driver 120, switch transistors connected to the inactive pixels 102 of the second inactive pixel regions 116B may be turned on to connect the column lines C1 to Cn to each other. In addition, when the row driver 120 selects the m-th row line Rm and the readout circuit 130 obtains pixel data from the inactive pixels 102 included in the second inactive pixel region 116B, the switch transistors connected to the inactive pixels 102 of the inactive pixel region 115B may be controlled to connect/separate the column lines C1 to Cn to/from each other.

The switch transistors, connecting/separating the column lines C1 to Cn to/from each other, may be connected to the pixel circuits of the inactive pixels 102, and may be disposed in the inactive pixels 102 or the readout circuit 130, as described above. In example embodiments illustrated in FIGS. 3 to 5 in which two or more inactive pixel regions are included, when the switch transistors are disposed in the readout circuit 130, switch transistors, respectively corresponding to the two or more inactive pixel regions, may be disposed in the readout circuit 130.

As an example, the readout circuit 130 may include analog-to-digital converters corresponding to column lines C1 to Cn, and a switch transistor may be included in the analog-to-digital converter. The analog-to-digital converters and column lines C1 to Cn may be disposed in one-to-one correspondence. For example, when the switch transistors are disposed in the readout circuit 130 in example embodiments illustrated in FIGS. 3 and 4, two switch transistors may be included in a single analog-to-digital converter. The two switch transistors, included in the single analog-to-digital converter, may be connected to the inactive pixels 102 in the first inactive pixel regions 115A and 115B and the inactive pixels 102 in the second inactive pixel regions 116A and 116B, respectively.

Figure 6:
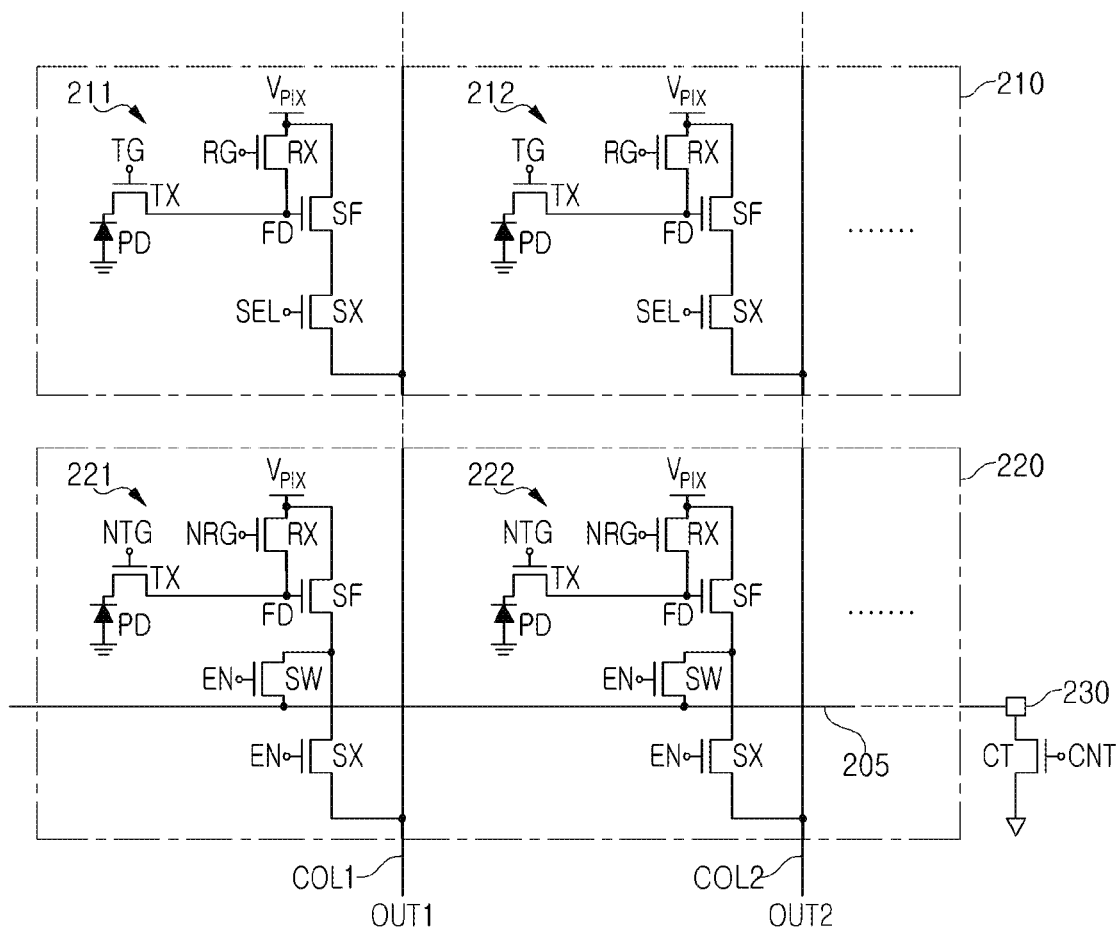
FIG. 6 illustrates a portion of pixels included in an image sensor according to example embodiments.
Figure 7:
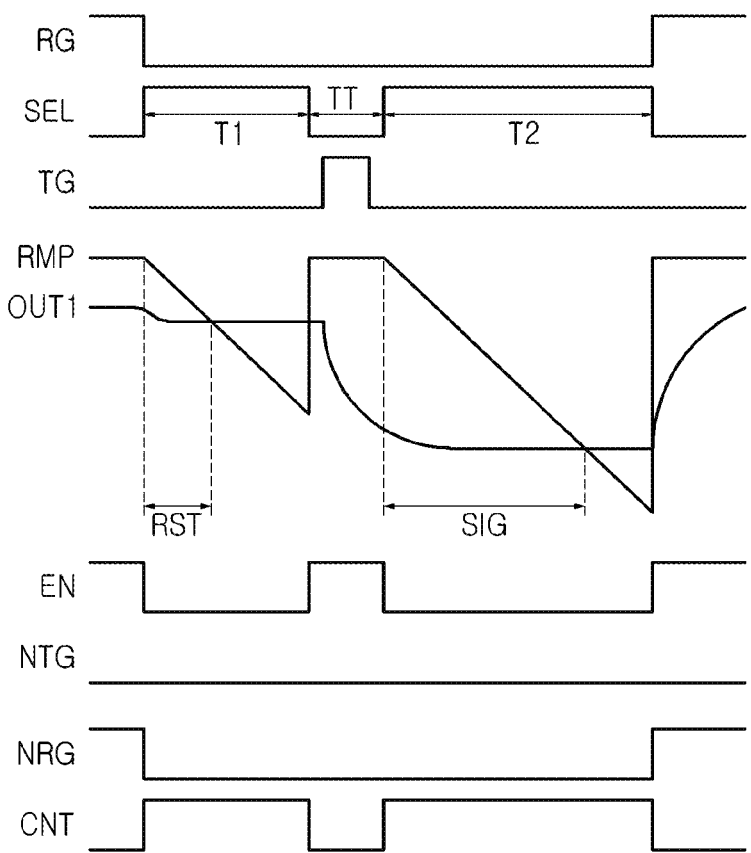
FIGS. 7 and 8 illustrate an operation of the image sensor according to example embodiments illustrated in FIG. 6
Figure 8:
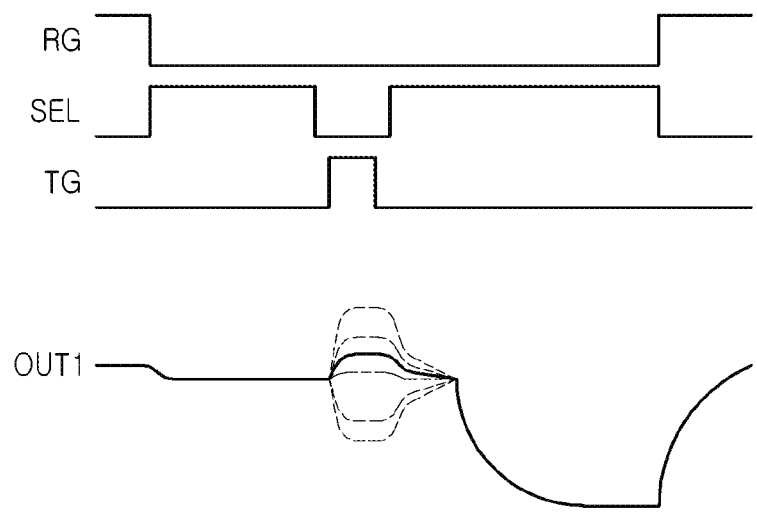

FIG. 6 illustrates a portion of pixels included in an image sensor according to some example embodiments. FIGS. 7 and 8 illustrate an operation of the image sensor according to example embodiments illustrated in FIG. 6

Referring first to FIG. 6, a pixel array 200 of an image sensor according to example embodiments includes active pixel regions 210 in which active pixels 211 and 212 are disposed, inactive pixel regions 220 in which inactive pixel 221 and 222 are dispose, and/or the like. The active pixels 211 and 212 and the inactive pixels 221 and 222, disposed in the same position in a first direction (a horizontal direction), may share column lines COL1 and COL2. As an example, the first active pixel 211 and the first inactive pixel 221 may share the first column line COL1, and the second active pixel 212 and the second inactive pixel 222 may share the second column line COL2.

Each of the active pixels 211 and 212 may include a photoelectric element PD, a transfer transistor TX, a reset transistor RX, a driving transistor SF, a selection transistor SX, and/or the like. Each of the inactive pixels 221 and 222 includes a photoelectric element PD, a transfer transistor TX, a reset transistor RX, a driving transistor SF, a selection transistor SX, a switch transistor SW, and/or the like. Elements, included in each of the active pixels 211 and 212 and the inactive pixels 221 and 222, may be controlled by a row driver connected to the pixel array 200.

In each of the inactive pixels 221 and 222, the switch transistor SW may be connected to a node between the driving transistor SF and the selection transistor SX and a connection line(s), for example connection wiring 205. When the switch transistor SW and the selection transistor SX are turned on in the inactive pixels 221 and 222, the column lines COL1 and COL2 may be electrically connected to each other through the connection wiring 205.

The connection wiring 205 may be connected to a power supply node for supplying a predetermined or alternatively, desired constant voltage through a connection pad 230 and a wiring transistor CT. When the switch transistor SW is turned off, the wiring transistor CT may be turned on to reduce or prevent the connection wiring 205 from floating.

Hereinafter, an operation of the image sensor according to example embodiments illustrated in FIG. 6 will be described with reference to FIGS. 7 and 8.

FIG. 7 illustrates an operation of obtaining a pixel signal from the active pixels 211 and 212. Referring to FIG. 7, the reset transistor RX is turned on by the reset control signal RG to reset a voltage of a floating diffusion region FD of the active pixels 211 and 212. When the reset operation is completed, the reset transistor RX is turned off, and the selection transistor SX may be turned on by the selection control signal SEL during a first time T1.

A readout circuit of an image sensor may obtain a reset signal RST by comparing a first output voltage OUT1, output through the first column line COL1, with a ramp voltage RMP during the first time T1. As an example, the readout circuit may obtain the reset signal RST by counting a time in which the ramp voltage RMP is higher than the first output voltage OUT1 of the first column line COL1. The readout circuit may simultaneously obtain reset signals RST of the first active pixel 211 and the second active pixel 212 through the first column line COL1 and the second column line COL2.

When the readout circuit obtains the reset signal and the first time T1 has elapsed, the selection transistor SX may turned off and the transmission transistor TX may be turned on during a transfer time TT. According to example embodiments, the turned-on time of the transfer transistor TX may be shorter than the turned-off time of the selection transistor SX. When the transfer transistor TX is turned on a transfer control signal RG during the transfer time TT, charges generated in the photoelectric element PD of the active pixels 211 and 212 may be transferred to the floating diffusion region FD. Therefore, the first output voltage OUT1 may be decreased, as illustrated in FIG. 7. The second output voltage OUT2 may also be decreased according to the amount of the charges transferred from the photoelectric element PD of the second active pixel 212 to the floating diffusion region FD after the transfer transistor TX is turned on.

When the transfer transistor TX is turned off and the selection transistor SX is turned on again, the readout circuit may obtain a pixel signal SIG by counting a second time T2 at which the ramp voltage RMP is higher than the first output voltage OUT1. Time, required for the readout circuit to obtain the pixel signal SIG, may be defined as the second time T2. Similarly to the reset signal RST, the readout circuit may simultaneously obtain pixel signals of the first active pixel 211 and the second active pixel 212 through the first column line COL1 and the second column line COL2.

An operation of the inactive pixels 221 and 222 may be different from an operation of the active pixels 211 and 212. An inactive reset signal NRG, input to the inactive pixels 221 and 222, may be the same as a reset signal RG input to the active pixels 211 and 212. On the other hand, in example embodiments illustrated in FIG. 7, the transfer transistor TX of the inactive pixels 221 and 222 may be maintained in a turned-off state during the first time T1, the second time T2, and the transfer time TT by an inactive transfer control signal NTG.

As the transfer transistor TX of the inactive pixels 221 and 222 is maintained in the turned-off state, charges may be excessively generated in the photoelectric element PD of the inactive pixels 221 and 222. In some example embodiments, an operation of resetting the photoelectric element PD of the inactive pixels 221 and 222 may be performed during a time, in which the active pixels 211 and 212 do not output pixel data, for example, a time between frame periods.

An enable signal EN, input to the selection transistor SX and the switch transistor SW of the inactive pixels 221 and 222, may be a complementary signal of the selection control signal SEL input to the selection transistor SX of the active pixels 211 and 212. Accordingly, the selection transistor SX and the switch transistor SW of the inactive pixels 221 and 222 may be turned on during the transmission time TT to electrically connect the column lines COL1 and COL2 to each other. To simultaneously receive the enable signal EN, the gate of the selection transistor SX and the gate of the switch transistor SW may be connected to each other.

In the active pixels 211 and 212, the transfer transistor TX may be turned on during the transfer time TT to transfer charges of the photoelectric element PD to the floating diffusion region FD. For example, a voltage on the column lines COL1 and COL2 may not be maintained as a reset voltage and may fluctuate due to a coupling effect, occurring due to on/off operations of the transfer transistor TX, or the like. In example embodiments illustrated in FIG. 6, the selection transistor SX and the switch transistor SW of the inactive pixels 221 and 222 may be turned on during the transfer time TT, such that connect the column lines COL1 and COL2 may be electrically connected to each other to cancel voltage fluctuations occurring in the respective column lines COL1 and COL2. Thus, fluctuation of the reset voltage may be significantly reduced, and the fluctuation of the reset voltage may be reduced or prevented from being reflected on noise in the pixel signal to improve noise characteristics of the image sensor.

The wiring transistor CT, connected to the connection wiring 205, may be controlled by the wiring control signal CNT, and the wiring control signal CNT may be a selection control signal SEL input to the active pixels 211 and 212. Accordingly, the connection wiring 205 may not float and may be maintained at a predetermined or alternatively, desired constant voltage during a time in which the column lines COL1 and COL2 are electrically separated from each other, for example, the first time T1 and the second time T2.

In example embodiments illustrated in FIG. 8, the column lines COL1 and COL2 may not be connected to each other while charges are transferred from the active pixels 211 and 212 of the image sensor to the floating diffusion region FD. Accordingly, the output voltages OUT1 and OUT2 of the column lines COL1 and COL2 may not be maintained as a reset voltage and may be increased or decreased. On the other hand, in example embodiments described with reference to FIG. 7, the column lines COL1 and COL2 may be connected to each other while the charges are transferred the active pixels 211 and 212 to the floating diffusion region FD, and thus, fluctuations of a reset voltage occurring in the respective column lines COL1 and COL2 may cancel each other.

Unlike what is described with reference to FIGS. 6 to 8, the switch transistors SW connecting the column lines COL1 and COL2 to each other may be disposed in the readout circuit rather than the inactive pixels 221 and 222. Even when the switch transistor SW is disposed in the readout circuit, one end of the switch transistor SW may be connected to the connection wiring 205, and the other end thereof may be connected to a node between the driving transistor SF and the selection transistor SX of each of the inactive pixels 221 and 222.

Figure 9:
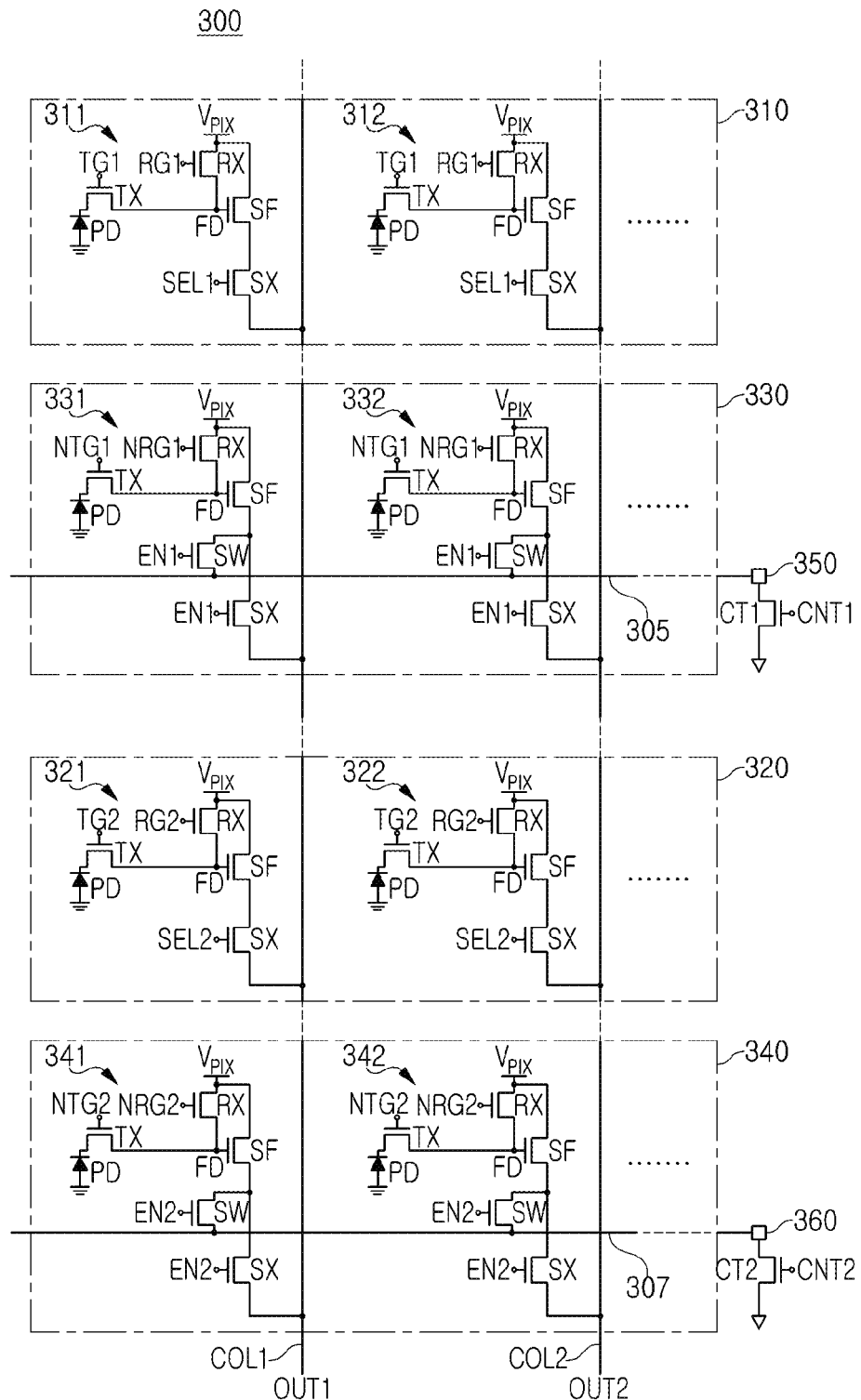
FIG. 9 illustrates a portion pixels included in an image sensor according to example embodiments.

FIG. 9 illustrates a portion of pixels included in an image sensor according to some example embodiments.

Figure 10:
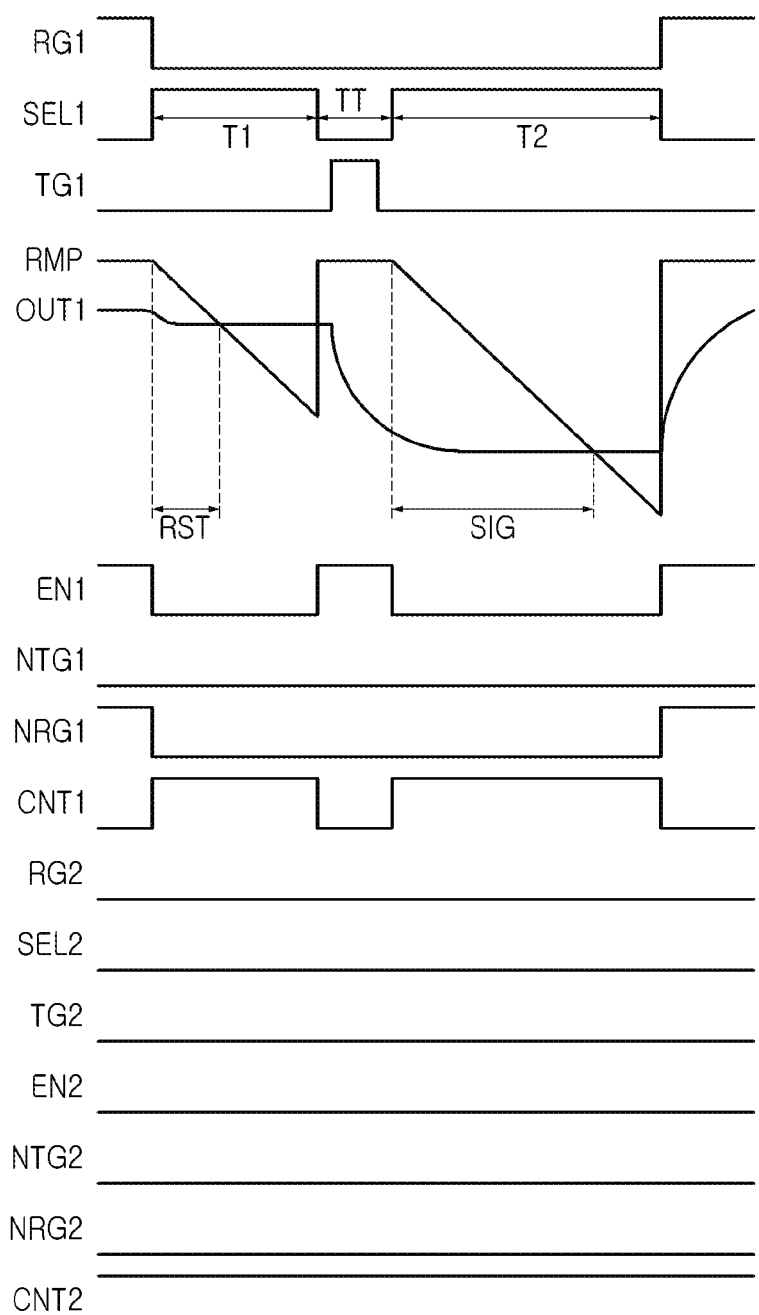
FIGS. 10 and 11 illustrate an operation of the image sensor according to example embodiments illustrated in FIG. 9.
Figure 11:
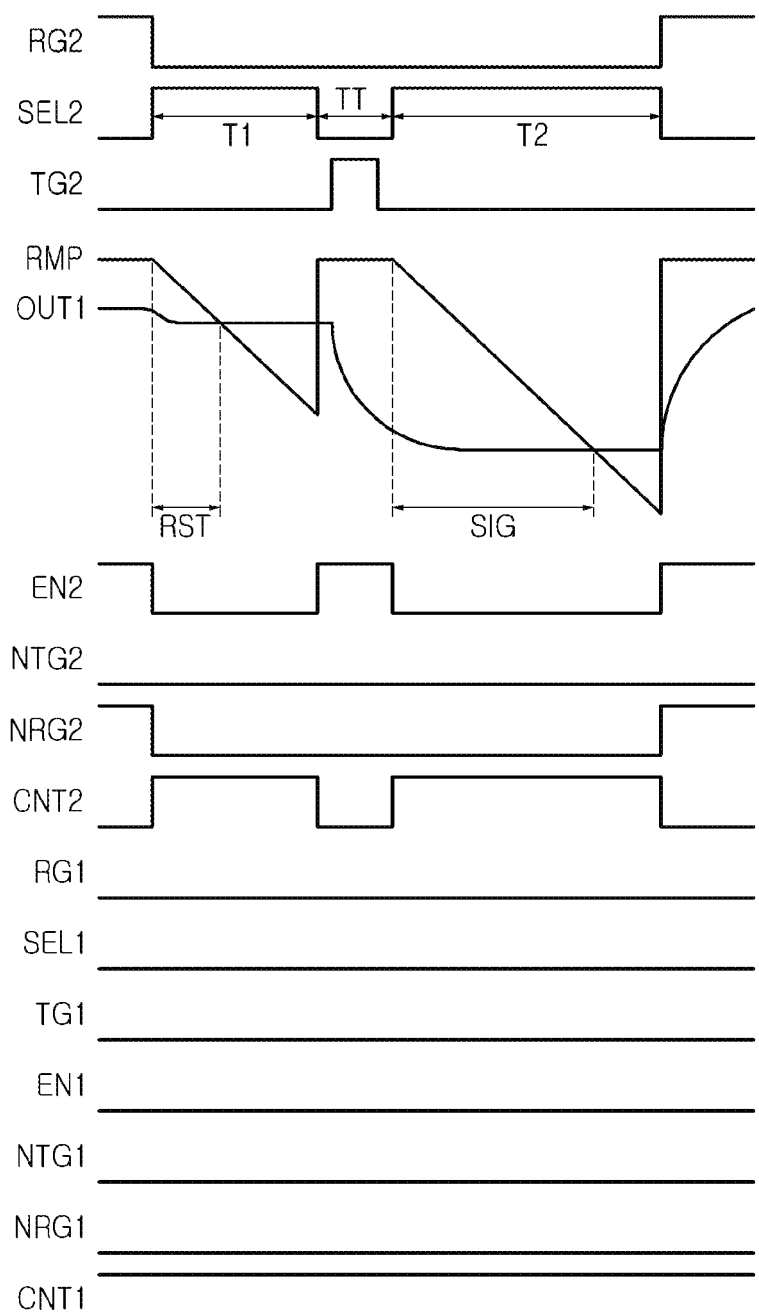

FIGS. 10 and 11 illustrate an operation of the image sensor according to example embodiments illustrated in FIG. 9.

Referring first to FIG. 9, a pixel array 300 of an image sensor according to some example embodiments may include active pixel regions 310 and 320 and inactive pixel regions 330 and 340. The active pixel regions 310 and 320 and the inactive pixel regions 330 and 340 may each extend in a first direction (a horizontal direction) and may share column lines COL1 and COL2. In example embodiments illustrated in FIG. 9, active pixel regions 310 and 320 and inactive pixel regions 330 and 340 may be alternately disposed in a second direction (a vertical direction).

Operations of active pixels 311, 312, 321, and 322 and inactive pixels 331, 332, 341, and 342 may be similar to those described with reference to FIGS. 6 and 7. The active pixels 311, 312, 321, 322 and the inactive pixels 331, 332, 341, 342 may operate in response to a reset control signals RG, a transmission control signals TG, and a selection control signal SEL input by a row driver. A readout circuit may obtain a reset signal and a pixel signal from the active pixels 311, 312, 321, and 322 through column lines COL1 and COL2. A transfer transistor TX of the inactive pixels 331, 332, 341, and 342 may be maintained in a turned-off state while the readout circuit obtains the reset signal and the pixel signal. A reset transistor RX of the inactive pixels 331, 332, 341, and 342 may operate in the same manner as a reset transistor RX of the active pixels 311, 312, 321, and 322.

FIG. 10 may illustrate an operation in which a readout circuit obtains pixel data from the active pixels 311 and 312 included in the first active pixel region 310. Referring to FIG. 10, the readout circuit may sequentially obtain a reset signal RST and a pixel signal SIG from the active pixels 311 and 312 at a first time T1 and a second time T2, respectively. When the readout obtains the reset signal RST, a selection transistor SX of the active pixels 311 and 312 may be turned off by a first selection signal SEL1 during a transfer time TT, and a switch transistor SW and the selection transistor SX may be turned on in the inactive pixels 331 and 332 of the first inactive pixel region 330 by a first enable signal EN1. When the switch transistor SW and the selection transistor SX are turned on, the column lines COL1 and COL2 may be electrically connected to each other through a first connection wiring 305. The first connection wiring 305 may be connected to a first wiring transistor CT1 through a first connection pad 350.

Since the column lines COL1 and COL2 are connected to each other during the transfer time TT, voltage fluctuations, occurring in the respective column lines COL1 and COL2 due to a coupling effect caused by the operation of the transfer transistor TX, or the like, may offset each other. Therefore, time required to stabilize a voltage on the column lines COL1 and COL2 after the transfer transistor TX is turned on/off may be reduced to improve readout speed and noise characteristics. During a time in which the column lines COL1 and COL2 are not connected, the first wiring transistor CT1 may be turned on by a first control signal CNT1 to input a constant voltage to the first connection wiring 305.

In example embodiments illustrated in FIG. 10, the second inactive pixel region 340 may not operate while a readout operation is performed on the first active pixel region 310. Referring to FIG. 10, a reset transistor RX, a selection transistor SX, and a switch transistor SW, included in the inactive pixels 341 and 342 of the second inactive pixel region 340, may all be maintained in a turned-off state by the second inactive set signal NRG2 and a second enable signal EN2 during the readout operation performed on the first active pixel region 310. On the other hand, a second wiring transistor CT2 may be turned on by a second control signal CNT2, and thus, a constant voltage may be input to a second connection wiring 307. The second connection wiring 307 may be connected to the second wiring transistor CT2 through a second connection pad 360.

FIG. 11 may illustrate an operation in which a readout circuit obtains pixel data from the active pixels 321 and 322 included in the second active pixel region 320. Referring to FIG. 11, the readout circuit may sequentially obtain a reset signal RST and a pixel signal SIG from the active pixels 321 and 322. Similarly to what is described with reference to FIG. 10, during the transfer time TT, the selection transistor SX of the active pixels 321 and 322 may be turned off by a second selection signal SEL2 and the switch transistor SW, the selection transistor SX may be turned on in the inactive pixels 341 and 342 of the second inactive pixel region 340 by the second enable signal EN2, and the column lines COL1 and COL2 may be connected to each other through the second connection wiring 307. Accordingly, voltage fluctuations occurring in the respective column lines COL1 and COL2 may be cancelled while the transmission transistor TX is turned on by a second transmission control signal TG2.

In addition, similarly to what is described with reference to FIG. 10, the first inactive pixel region 330 may not operate during a readout operation performed on the second active pixel region 320. Referring to FIG. 11, the reset transistor RX, the selection transistor SX, and the switch transistor SW, included in the inactive pixels 331 and 332 of the first inactive pixel region 330, may be all maintained in a turned-off state by the first enable signal EN1 during the readout operation on the second active pixel region 320. In addition, the first wiring transistor CT1 may be turned on by the first control signal CNT1, and thus, a constant voltage may be input to the first connection wiring 305.

Figure 12:
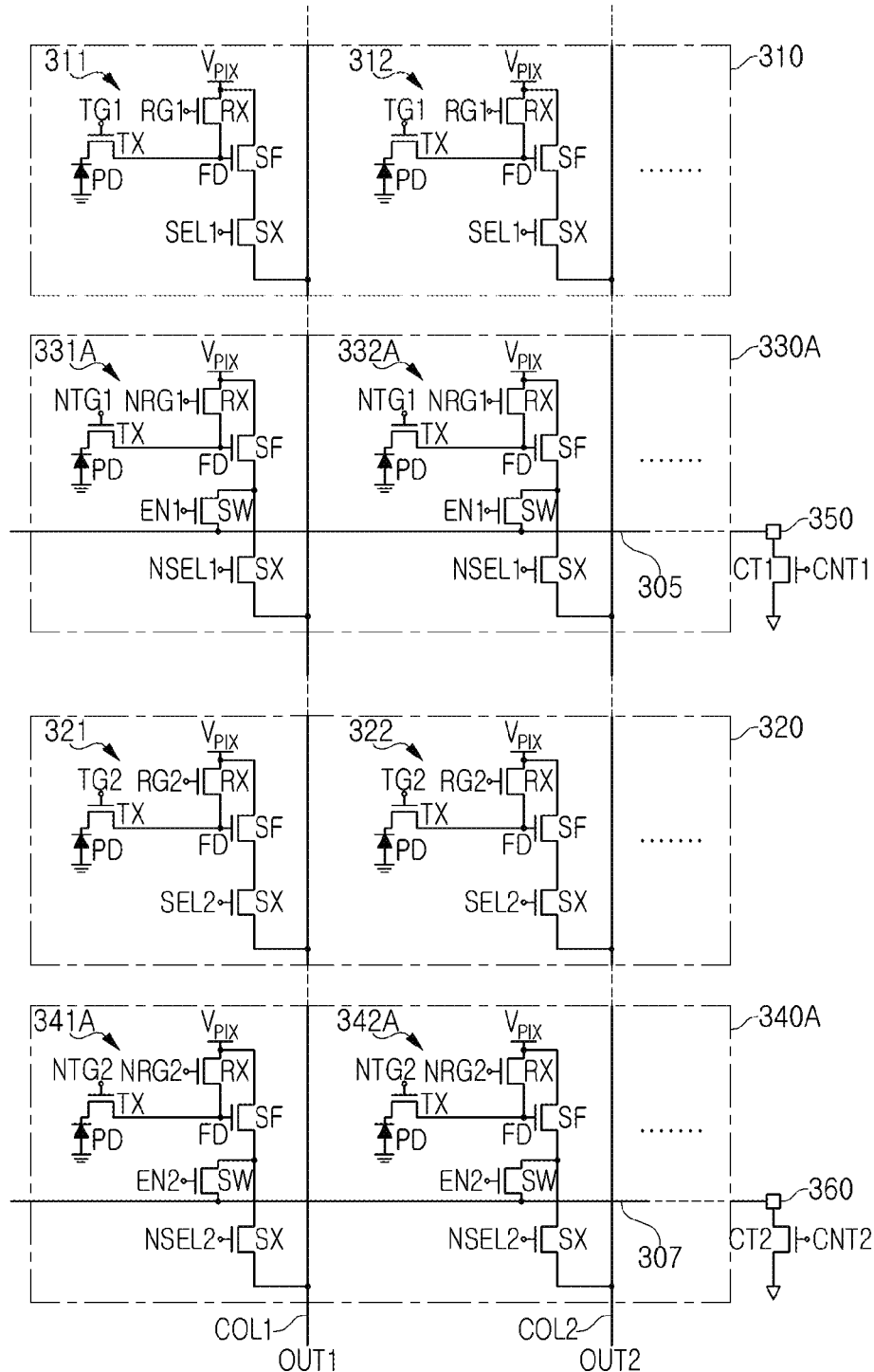
FIG. 12 illustrates a portion of pixels included in an image sensor according to example embodiments.
Figure 13:
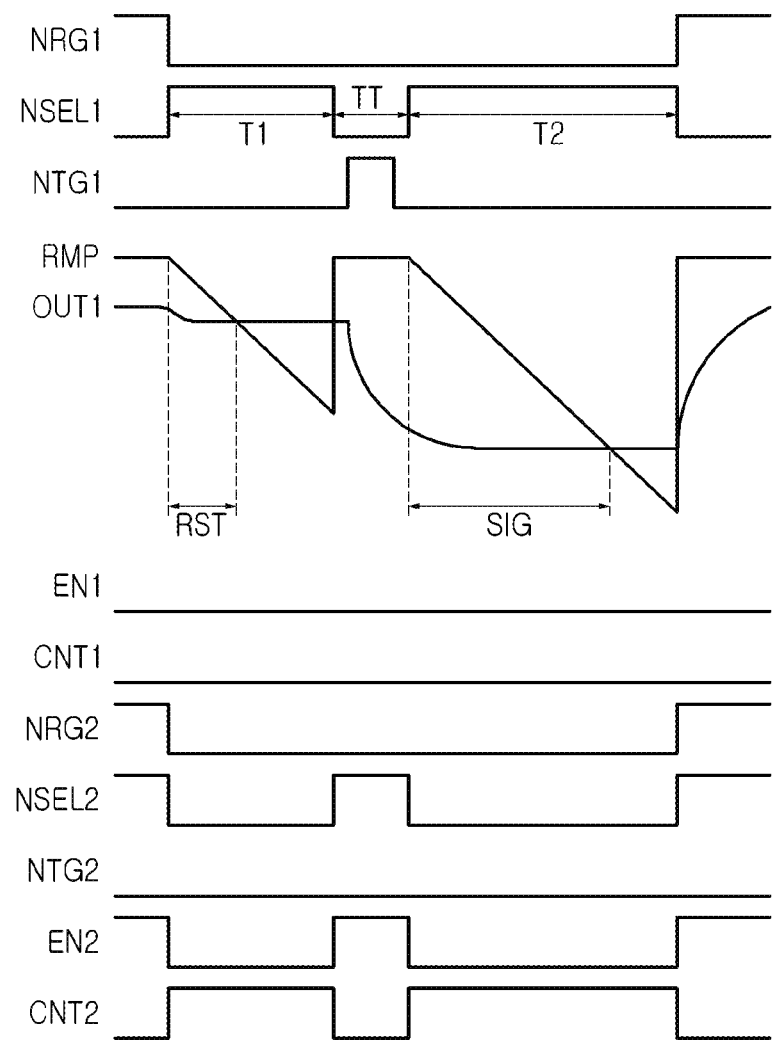
FIG. 13 illustrates an operation of the image sensor according to example embodiments illustrated in FIG. 12.

FIG. 12 illustrates a portion of pixels included in an image sensor according to some example embodiments, and FIG. 13 illustrates an operation of the image sensor according to example embodiments illustrated in FIG. 12.

Referring to FIG. 12, a pixel array 300A of an image sensor according to example embodiments may include active pixel regions 310 and 320 and inactive pixel regions 330A and 340A. In example embodiments illustrated in FIG. 12, the inactive pixel regions 330A and 340A may also output a reset signal and a pixel signal to a readout circuit. To output the reset signal and the pixel signal, a switch transistor SW and a selection transistor SX may be controlled by different signals in the inactive pixels 331A, 332A, 341A, and 342A, respectively. Hereinafter, this will be described in further detail with reference to FIG. 13 together.

FIG. 13 may illustrate an operation in which a readout circuit reads a reset signal RST and a pixel signal SIG from the first inactive pixels 331A and 332A included in the first inactive pixel region 330A. In example embodiments illustrated in FIG. 13, floating diffusion regions FD of the inactive pixels 331A and 332A may be reset by a first inactive reset signal NRG1, and the readout circuit may read out a signal RST during a first time T1. During the first time T1, the selection transistors SX of the inactive pixels 331A and 332A may be turned on in response to a first inactive selection signal NSEL1, and the switch transistor SW may be maintained in a turned-off state by a first enable signal EN1.

During a transfer time TT subsequent to the first time T1, the transfer transistors TX of the inactive pixels 331A and 332A may be turned on by a first inactive transfer control signal NTG1, and charges of a photoelectric element PD may be transferred to the floating diffusion region FD. During the transfer time TT, the switch transistor SW and the selection transistor SX of the second inactive pixel region 340A may be turned on to electrically connect the column lines COL1 and COL2 to each other. In other words, when pixel data is obtained from the first inactive pixel region 330A, column lines COL1 and COL2 may be connected to each other by the second inactive pixel region 340A. In addition, when the pixel data is obtained from the second inactive pixel region 340A, the column lines COL1 and COL2 may be connected to each other by the first inactive pixel region 330A.

When the transfer time TT elapses, the selection transistors SX of the inactive pixels 331A and 332A may be turned on during the second time T2 and the readout circuit may obtain a pixel signal SIG from the inactive pixels 331A and 332A. The selection transistors SX of the inactive pixels 331A and 332A may be continuously maintained in the turned-off state.

Figure 14:
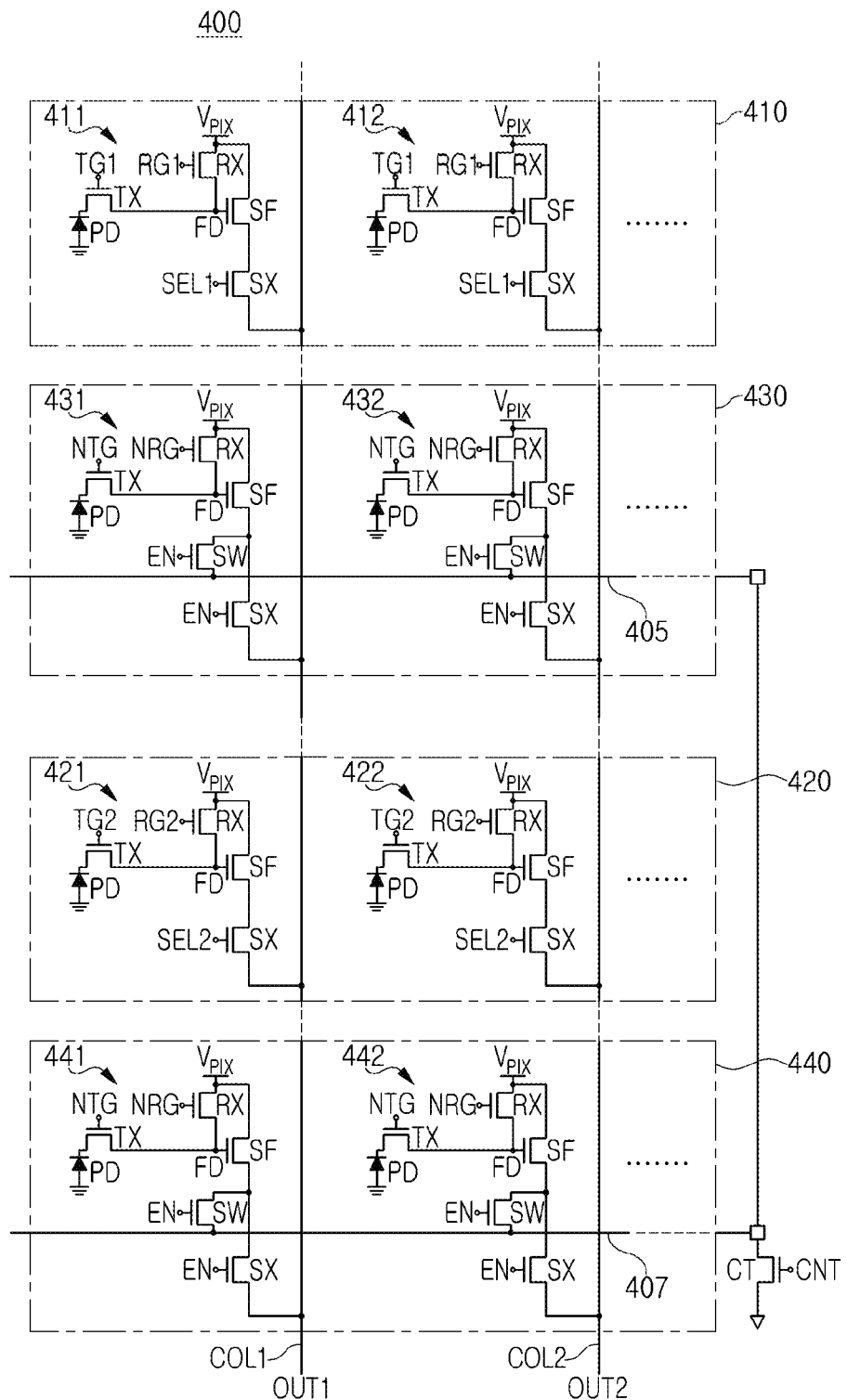
FIG. 14 illustrates a portion of pixels included in an image sensor according to example embodiments.
Figure 15:
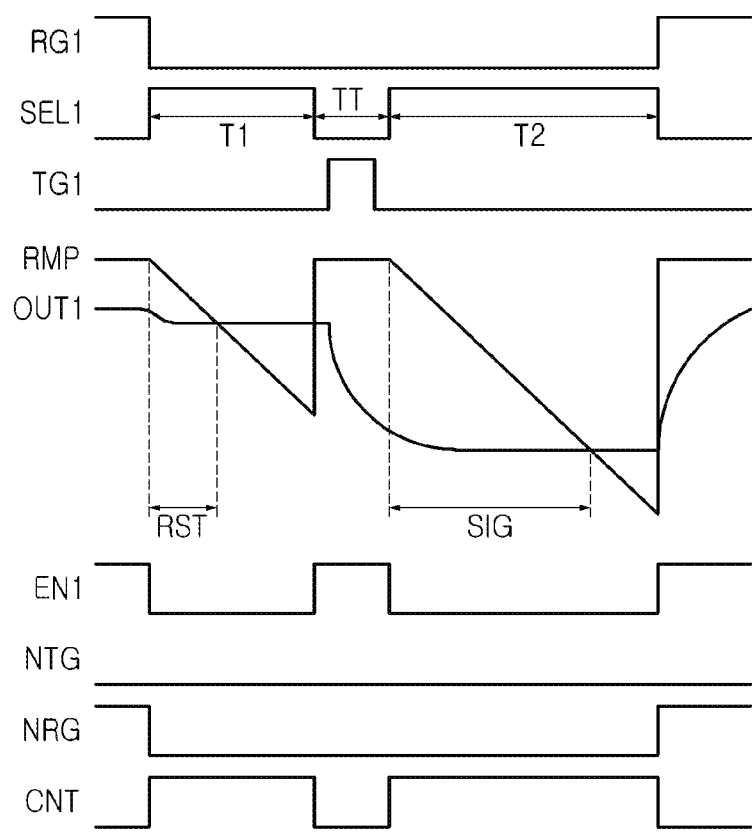
FIG. 15 illustrates an operation of the image sensor according to example embodiments illustrated in FIG. 14.

FIG. 14 illustrates a portion of pixels included in an image sensor according to some example embodiments, and FIG. 15 illustrates an operation of the image sensor according to example embodiments illustrated in FIG. 14.

Referring to FIG. 14, a pixel array 400 of an image sensor according to some example embodiments may include active pixel regions 410 and 420 and inactive pixel regions 430 and 440. The dispositions of the active pixel regions 410 and 420 and the inactive pixel regions 430 and 440, the circuit configurations and operations of the active pixels 411, 412, 421, and 422, and/or the like, will be understood with reference to example embodiments described with reference to FIG. 9.

In example embodiments illustrated in FIG. 14, the inactive pixels 431, 432, 441, and 442 may operate simultaneously. As an example, all of the inactive pixels 431, 432, 441, and 442 may operate while a readout operation is performed on the first active pixel region 410. In addition, all of the inactive pixels 431, 432, 441, and 442 may operate while a readout operation is performed on the second active pixel region 420.

Referring to FIG. 14, reset transistors RX of the inactive pixels 431, 432, 441, and 442 may commonly receive an inactive reset control signal NRG, and transfer transistors TX thereof may commonly receive an inactive transfer control signal NTG. In addition, an enable signal EN may be commonly input to switch transistors SW and selection transistors SX of the inactive pixels 431, 432, 441, and 442. Hereinafter, the operation of the image sensor will be described with reference to FIG. 15 together.

FIG. 15 illustrates a readout operation performed on the active pixels 411 and 412 included in the first active pixel region 410. Referring to FIG. 15, the reset transistor RX may be turned on by a first reset control signal RG1 to reset a voltage of the floating diffusion region FD, and the read output circuit may read a reset signal RST from the active pixels 411 and 412 during a first time T1 in which a selection transistor SEL1 is turned on by a first selection control signal SEL1 During a transfer time TT, the selection transistor SEL1 may be turned off by the first selection control signal SEL1 and a transfer transistor TX may be turned on by a first transfer control signal TG1, and thus, charges of a photoelectric element may be transferred to a floating diffusion region FD. Then, the readout circuit may read a pixel signal SIG during a second time T2.

Referring to FIG. 15, inactive pixels 431, 432, 441, and 442 included in the inactive pixel regions 430, 440 may operate in the same manner. The transfer transistor TX of the inactive pixels 431, 432, 441, and 442 may be maintained in a turned-off state by an inactive transfer control signal NTG. In addition, an inactive reset control signal NRG may be the same signal as the first reset control signal RG1, and an enable signal EN may be complementary to the first selection control signal SEL1. Accordingly, selection transistors SX and switch transistors SW of the inactive pixels 431, 432, 441, and 442 may operate opposite to selection transistors SX of the active pixels 411 and 412.

While the transfer transistors TX are turned on in the active pixels 411 and 412 are turned on to transfer charges to a floating diffusion region FD, the selection transistors SX and the switch transistors SW of the inactive pixels 431, 432, 441, and 442 may be turned on and column lines COL1 and COL2 may be connected to each other by connection wirings 405 and 407. Therefore, fluctuations of voltages on the column lines COL1 and COL2, caused by on/off operations of the transfer transistors TX, may cancel each other to be significantly reduced and noise characteristics may be improved.

A wiring control signal CNT, controlling a wiring transistor CT connected to the connection wirings 405 and 407, may be a complementary signal of the enable signal EN. Therefore, when the column lines COL1 and COL2 are not connected to each other, the connection wirings 405 and 407 may receive a constant voltage through the wiring transistor CT and the connection wirings 405 and 407 may be reduced or prevented from floating.

Figure 16:
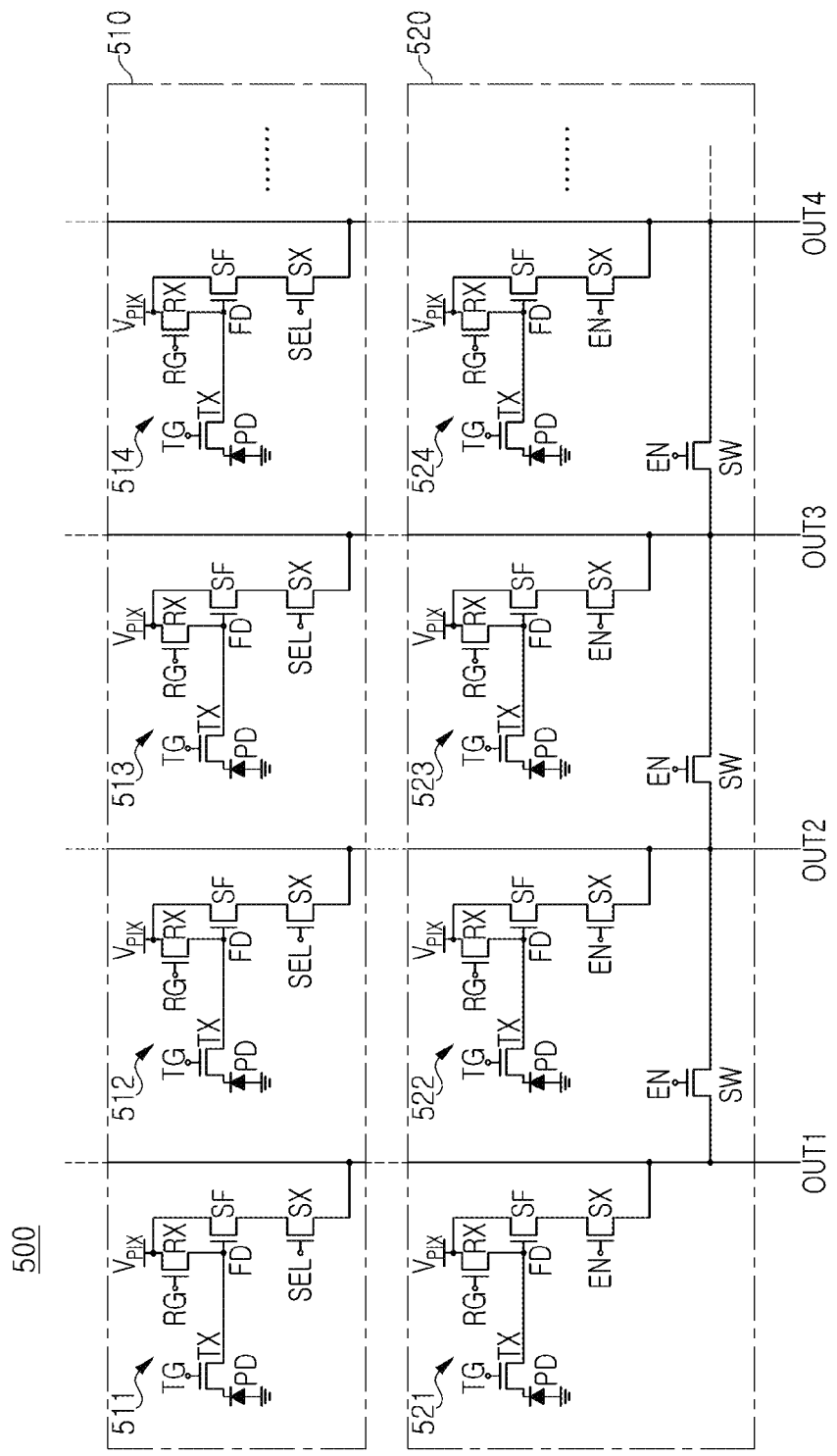
FIG. 16 illustrates a portion of pixels included in an image sensor according to example embodiments.

FIG. 16 illustrates a portion of pixels included in an image sensor according to some example embodiments.

Referring to FIG. 16, a pixel array 500 of an image sensor according to some example embodiments may include an active pixel region 510, an inactive pixel region 520, and/or the like. The operations of active pixels 511 to 514, included in the active pixel region 510, will be understood with reference to the above-described example embodiments.

In example embodiments illustrated in FIG. 16, at least a portion of inactive pixels 521 to 524 may include switch transistors SW connected between column lines COL1 to COL4. The switch transistor SW may be controlled by an enable signal EN controlling a selection transistor SX of each of the inactive pixels 521 to 524. The switch transistor SW may not be included in at least one of the inactive pixels 521 to 524.

The operations of the inactive pixels 521 to 524 may be similar to those of example embodiments described above with reference to FIG. 7. In a readout operation in which a readout circuit obtains pixel data from the active pixels 511 to 514 through the column lines COL1 to COL4, reset transistors RX of the inactive pixels 521 to 524 may operate in the same manner as reset transistor RX of the active pixels 511 to 514. Transfer transistors TX of the inactive pixels 521 to 524 may be maintained in a turned-off state.

In the inactive pixels 521 to 524, the selection transistors SX and the switch transistors SW may be controlled by a complementary signal of a selection control signal SEL input to the active pixels 511 to 514. Accordingly, during a time in which the readout circuit obtains a reset signal and a pixel signal, the select transistors SX and the switch transistors SW of the inactive pixels 521 to 524 may be turned off. On the other hand, during a time in which the transfer transistors TX of the active pixels 511 to 514 are turned on to transfer charges to floating diffusion regions FD, the selection transistors SX and the switch transistors SW of the inactive pixels 521 to 524 may be turned on, and the column lines COL1 to COL4 may be electrically connected to each other. Therefore, fluctuations of voltages on the column lines COL1 to COL4 may be significantly reduced.

Figure 17:
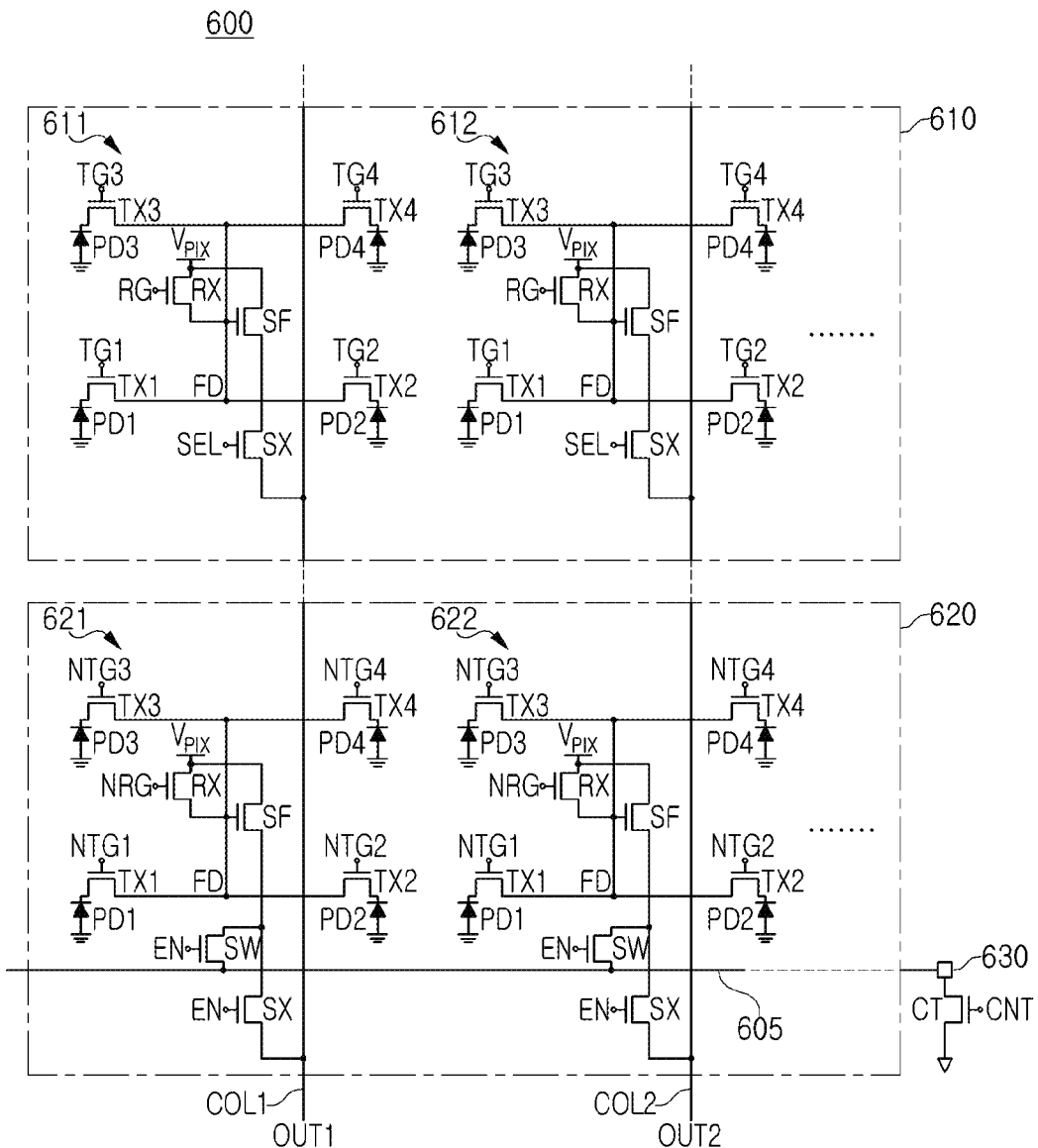
FIG. 17 illustrates a portion of pixels included in an image sensor according to example embodiments.
Figure 18:
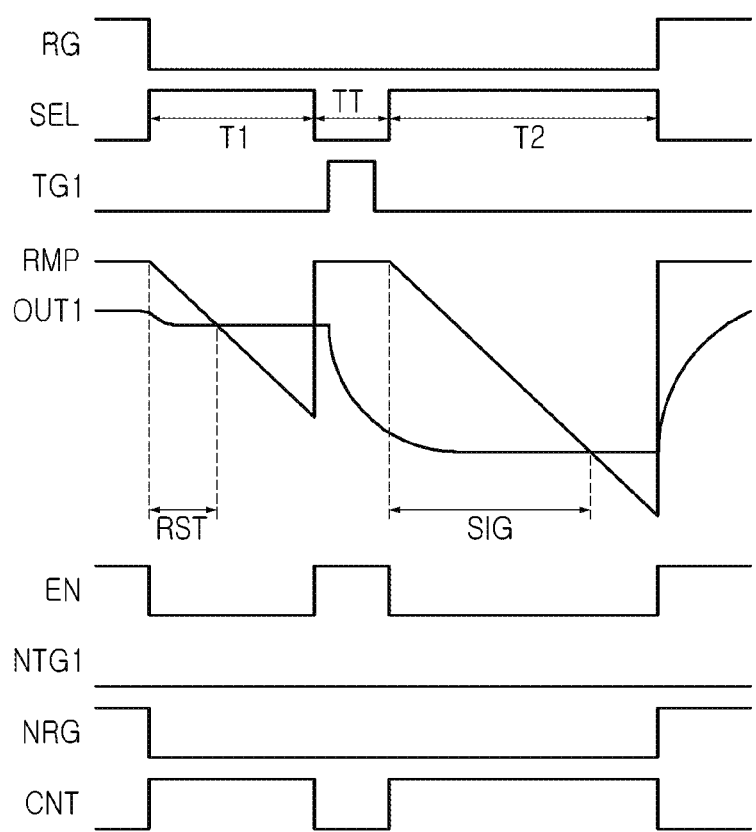
FIG. 18 illustrates an operation of the image sensor according to example embodiments illustrated in FIG. 17.

FIG. 17 illustrates a portion of pixels included in an image sensor according to some example embodiments, and FIG. 18 illustrates an operation of the image sensor according to example embodiments illustrated in FIG. 17.

Referring to FIG. 17, in a pixel array 600 of an image sensor according to some example embodiments, two or more pixels adjacent to each other may share a portion of elements included in a pixel circuit. In example embodiments illustrated in FIG. 17, four pixels adjacent to each other may share a reset transistor RX, a driving transistor SF, and a selection transistor SX.

Active pixel groups 611 and 612 may each include four photoelectric elements PD1 to PD4 and four transfer transistors TX1 to TX4. The four transfer transistors TX1 to TX4 of each of the active pixel groups 611 and 612 may share a reset transistor RX, a driving transistor SF, and a selection transistor SX through a single floating diffusion region FD. Similarly, inactive pixel groups 621 and 622 may each include four photoelectric elements PD1 to PD4 and four transfer transistors TX1 to TX4. The transfer transistors TX1 to TX4 of each of the inactive pixel groups 621 and 622 may share not only a reset transistor RX, a driving transistor SF, and a selection transistor SX but also a switch transistor SW.

A readout circuit may simultaneously obtain pixel data, corresponding to a charge generated by a first photoelectric element PD1 of the first active pixel group 611, and pixel data corresponding to a charge generated by a first photoelectric element PD1 of the second active pixel group 612. In example embodiments illustrated in FIG. 17, the first to fourth photoelectric elements PD1 to PD4 may sequentially obtain the pixel data, but the order of obtaining the pixel data is not limited thereto.

Referring to FIG. 18 together, reset transistors RX included in the inactive pixel groups 621 and 622 may operate in the same manner as reset transistors RX included in the active pixel groups 611 and 612 while the readout circuit reads a reset signal and a pixel signal to obtain pixel data. On the other hand, all of the transfer transistors TX1 to TX4 included in the inactive pixel groups 621 and 622 may be maintained in a turned-off state, and selection transistors SX included in the inactive pixel groups 621 and 622 may operate opposite to selection transistors SX included in the active pixel groups 611 and 612.

The selection transistors SX and the switch transistors SW may be turned on in the inactive pixel groups 621 and 622 while the selection transistor SX is turned off and charges of the first photoelectric element PD1 are transferred to the floating diffusion region FD in the active pixel groups 611 and 612. Accordingly, column lines COL1 and COL2 may be electrically connected to each other, and fluctuations of voltages on the column lines COL1 and COL2, caused by on/off operations of the first transistor TX1 of each of the active pixel groups 611 and 612, may be significantly reduced. Similarly to the other example embodiments described above, a wiring transistor CT connected to a connection wiring 605 may operate opposite to the switch transistor SW.

Figure 19:
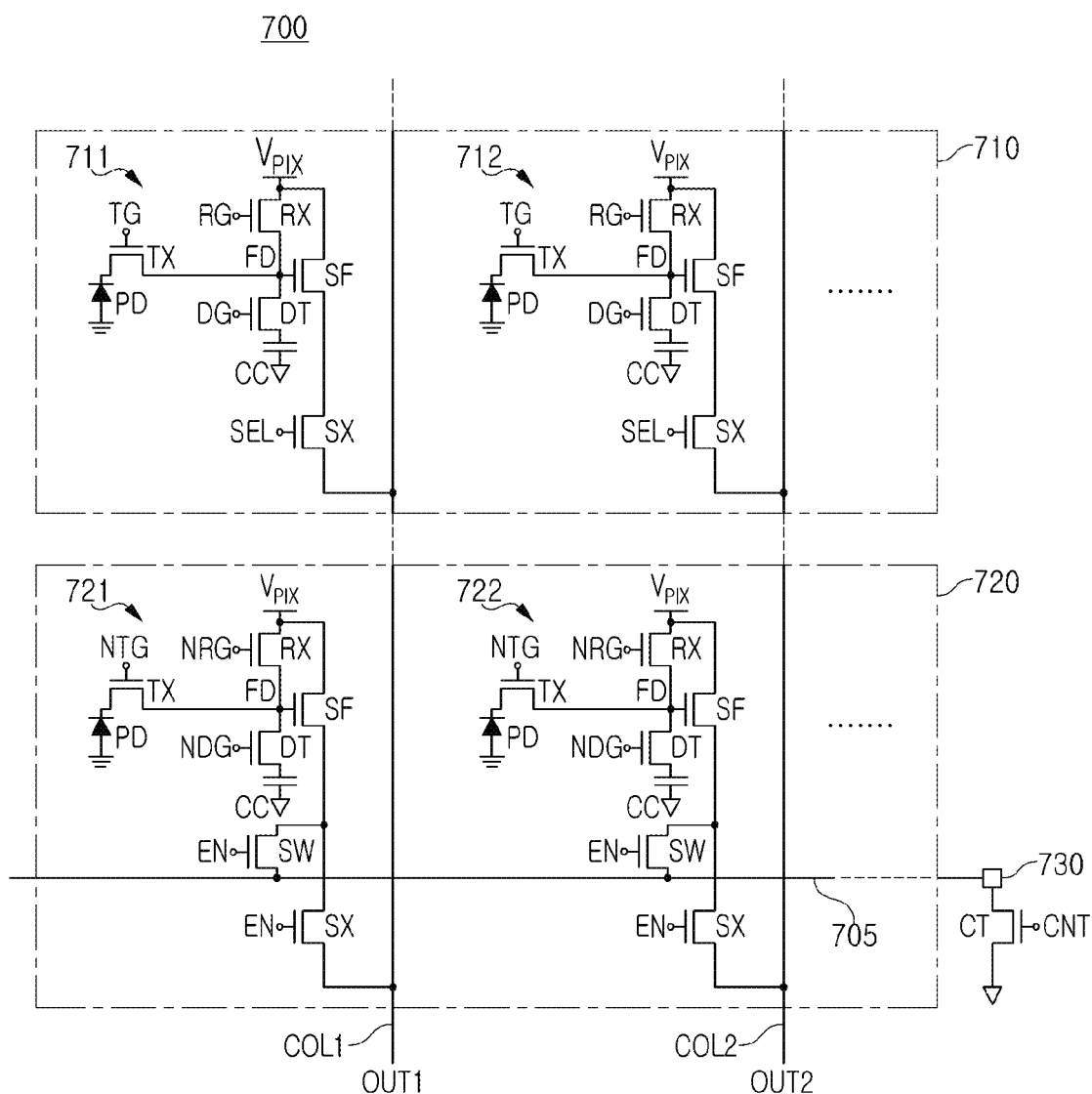
FIG. 19 illustrates a portion of pixels included in an image sensor according to example embodiments.

FIG. 19 illustrates a portion of pixels included in an image sensor according to some example embodiments.

In example embodiments illustrated in FIG. 19, a pixel array 700 may include an active pixel region 710 and an inactive pixel region 720. Active pixels 711 and 712 may each include a dual transistor DT, which may adjust a conversion gain, and a capacitor CC. The dual transistor DT and the capacitor CC may be connected to a floating diffusion region FD in each of the active pixels 711 and 712.

As an example, when a high conversion gain is required, the dual transistor DT may be turned off to decrease a capacitor of the floating diffusion region FD. On the other hand, when a low conversion gain is required, the dual transistor DT may be turned on to increase the capacitor of the floating diffusion region FD. In some example embodiments, an image sensor may determine illuminance of a surrounding environment at a point in time of image capturing. The image sensor may increase a conversion gain when the illuminance is low, and may decrease a conversion gain when the illuminance is high.

Referring to FIG. 19, inactive pixels 721 and 722 may each also include a dual transistor DT and a capacitor CC. The dual transistors DT of the inactive pixels 721 and 722 may be controlled in the same manner as the dual transistors DT of the active pixels 711 and 712. As an example, when the dual transistor∟ DT of the active pixels 711 and 712 are turned on and a conversion gain is decreased, the dual transistors DT of the inactive pixels 721 and 722 may also be turned on. When the dual transistors DT of the active pixels 711 and 712 are turned off and the conversion gain is increased, the dual transistors DT of the inactive pixels 721 and 722 may also be turned off.

Figure 20:
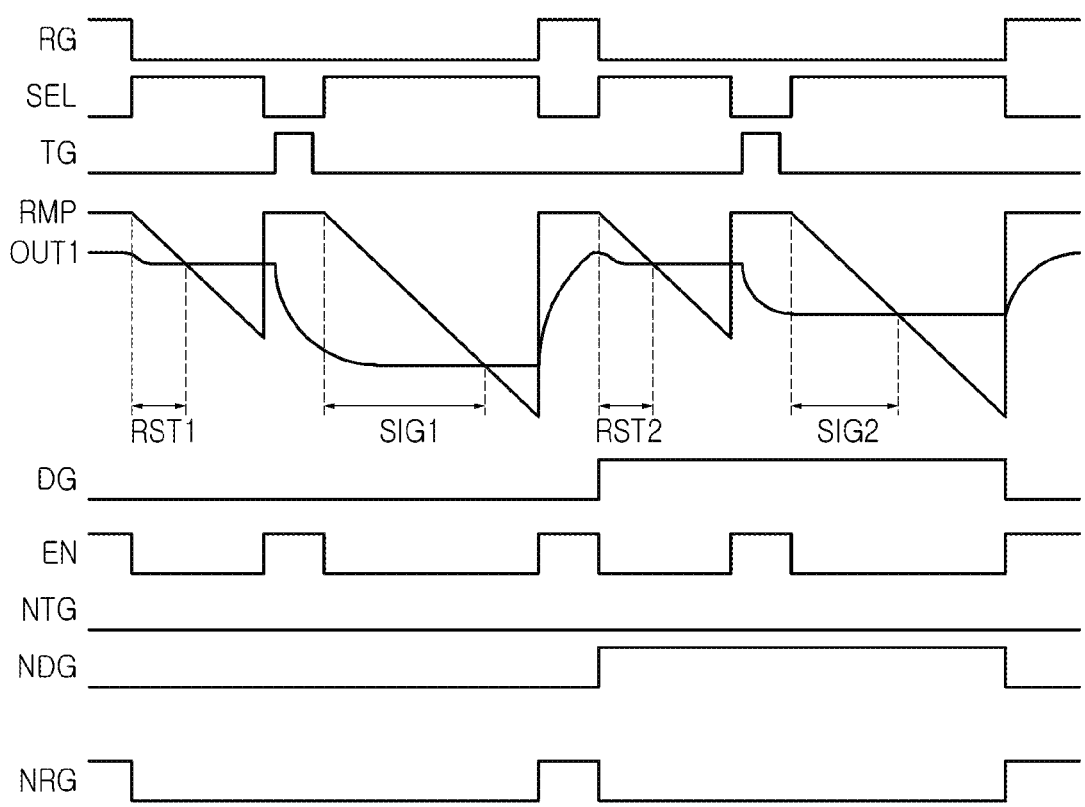
FIG. 20 illustrates an operation of the image sensor according to example embodiments illustrated in FIG. 19.

FIG. 20 illustrates an operation according to some example embodiments of an image sensor including the pixel array 700 illustrated in FIG. 19. Referring to FIG. 20, a readout circuit of the image sensor may read reset signals RST1 and RST2 and pixel signals SIG1 and SIG2 twice from the active pixels 711 and 712. In some example embodiments, a first conversion gain of the active pixels 711 and 712 while the readout circuit reads the first reset signal RST1 and the first pixel signal SIG1 is may be different from a second conversion gain of the active pixels 711 and 712 while the readout circuit reads the first resets signal RST1 and the first pixel signal SIG1. As an example, the first conversion gain may be greater than the second conversion gain.

As illustrated in FIG. 20, the conversion gains of the active pixels 711 and 712 may be adjusted and the readout circuit may obtain pixel data two or more times to improve a dynamic range of a resultant image generated by the image sensor. As an example, the dynamic range of the resultant image may be improved by applying pixel data, obtained at a low conversion gain, to a pixel representing a bright region and applying pixel data, obtained at a high conversion gain, to a pixel representing a dark region.

Referring to FIG. 20, as described above, an inactive dual control signal NDG controlling the dual transistor DT of the inactive pixels 721 and 722 may be the same as an active dual control signal DG input to the transistors DT of the active pixels 711 and 712. In addition, an enable signal EN controlling a switch transistor SW and a selection transistor SX of each of the inactive pixels 721 and 722 may be a complementary signal of a selection control signal SEL controlling selection transistors SW of the active pixels 711 and 712.

Figure 21:
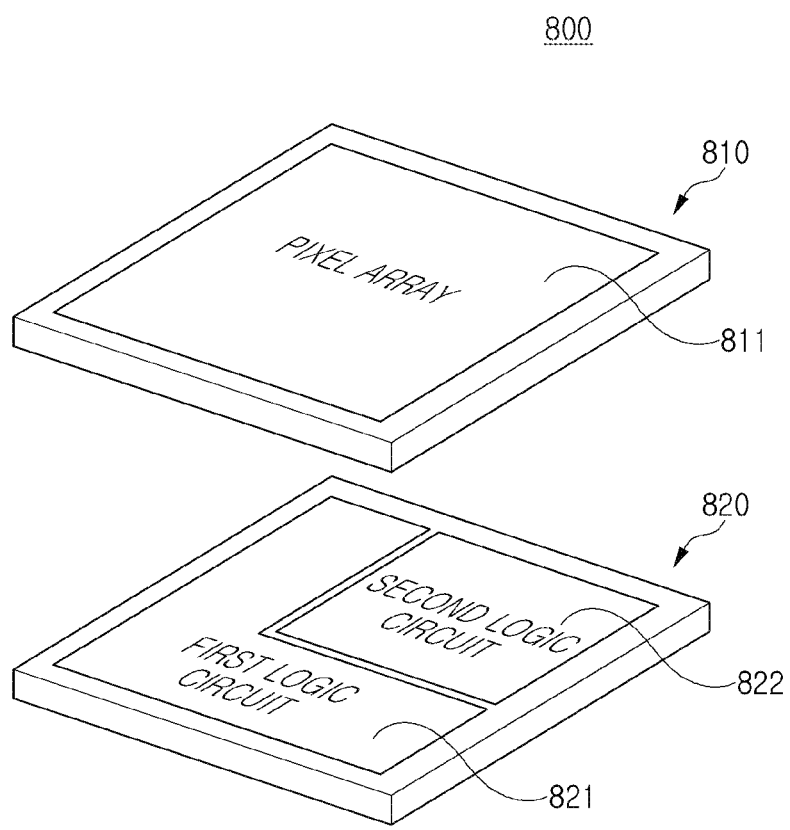
FIGS. 21 and 22 are schematic diagrams of image sensors according to example embodiments.
Figure 22:
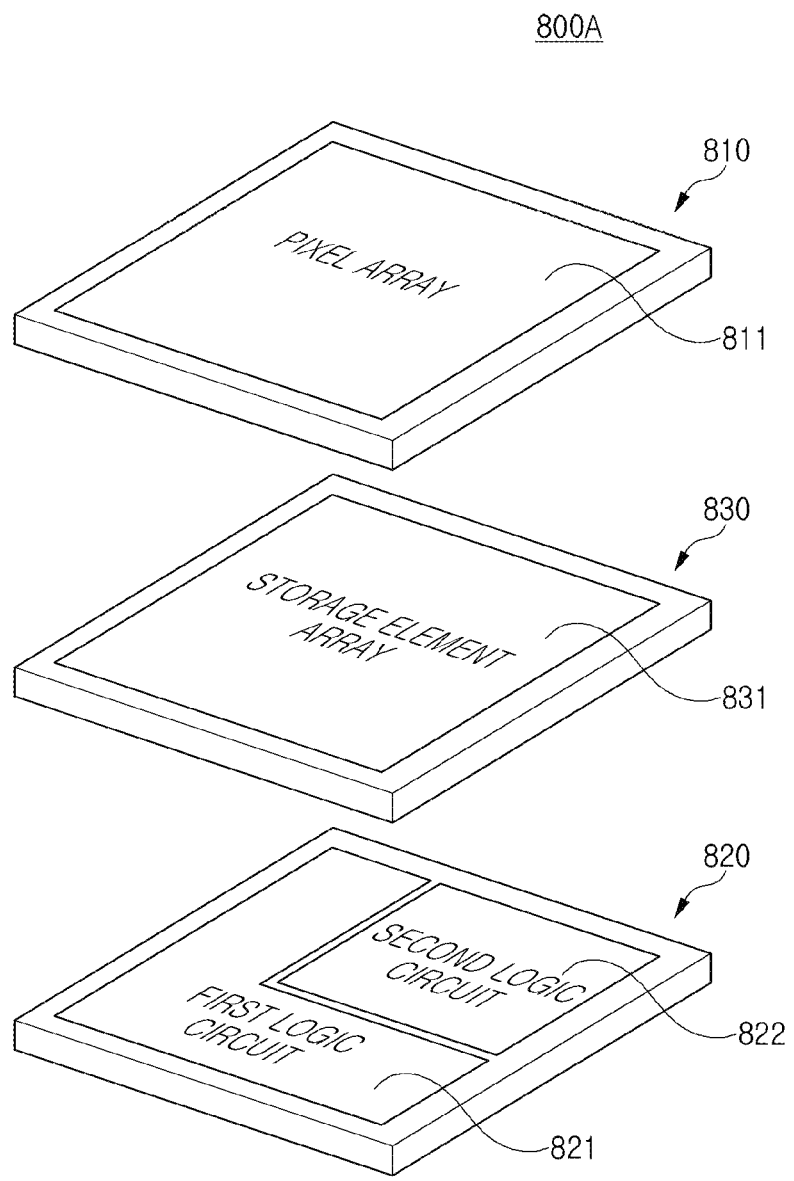

FIGS. 21 and 22 are schematic diagrams of image sensors according to some example embodiments.

Referring to FIG. 21, an image sensor 800 according to some example embodiments may include a first layer 810 and a second layer 820. The first layer 810 and the second layer 820 may be stacked in a vertical direction.

The first layer 810 may include a pixel array 811, and the second layer 820 may include logic circuits 821 and 822. The pixel array 811 may be connected to the logic circuits 821 and 822 through a plurality of row lines and a plurality of column lines. As described with reference to FIGS. 1 to 20, the pixel array 811 may include an active pixel region and an inactive pixel region. Active pixels, output pixel data required to generate a resultant image, may be disposed in the active pixel region. On the other hand, inactive pixels disposed in the inactive pixel region may not output pixel data. Therefore, a transfer transistor connected between a photoelectric element and a floating diffusion region in each of the inactive pixels may be maintained in a turned-off state while a readout operation is performed on the pixel array 811.

The logic circuits 821 and 822 may include a first logic circuit 821 and a second logic circuit 822. The first logic circuit 821 may include a row driver, a readout circuit, a column driver, a control logic, and/or the like, required to drive the pixel array 811. The second logic circuit 822 may include a power supply circuit, an input/output interface, an image signal processor, and/or the like. An area, a disposition, and/or the like, of each of the first logic circuit 821 and the second logic circuit 822 may be variously changed.

Inactive pixels, included in the pixel array 811, may be connected to a switch transistor which may electrically connect column lines to each other. The switch transistor may be connected to a single node, among nodes of a pixel circuit included in each of the inactive pixels, or may be directly connected to a column line. The switch transistor may be disposed in each of the inactive pixels or may be disposed in the first logic circuit 821. When the switch transistor is disposed in the first logic circuit 821, a switch transistor may be included in an analog-to-digital converter connected to the column lines.

Referring to FIG. 22, an image sensor 800A may include a first layer 810, a second layer 820, and a third layer 830 disposed between the first layer 810 and the second layer 820. The first layer 810 and the second layer 820 may be similar to those of example embodiments described with reference to FIG. 21. The third layer 830 may include a storage device array 831. The storage device array 31 may include a storage element such as a metal-insulator-metal (MIM) capacitor, a charge trapping element, a magnetic tunnel junction (MTJ) element, a germanium (Ge)-antimony (Sb)-tellurium (Te) (GST) element, or the like. The storage elements may be connected to at least one of pixels and/or logic circuits 821 and 822 formed in the first layer 810.

The configurations of the image sensors 800 and 800A are not limited to those illustrated in FIGS. 21 and 22, and may be variously changed. As an example, a portion of the logic circuits 821 and 822, for example, at least a portion of the first logic circuit 821 may be disposed on the first layer 810 together with the pixel array 811.

Figure 23:
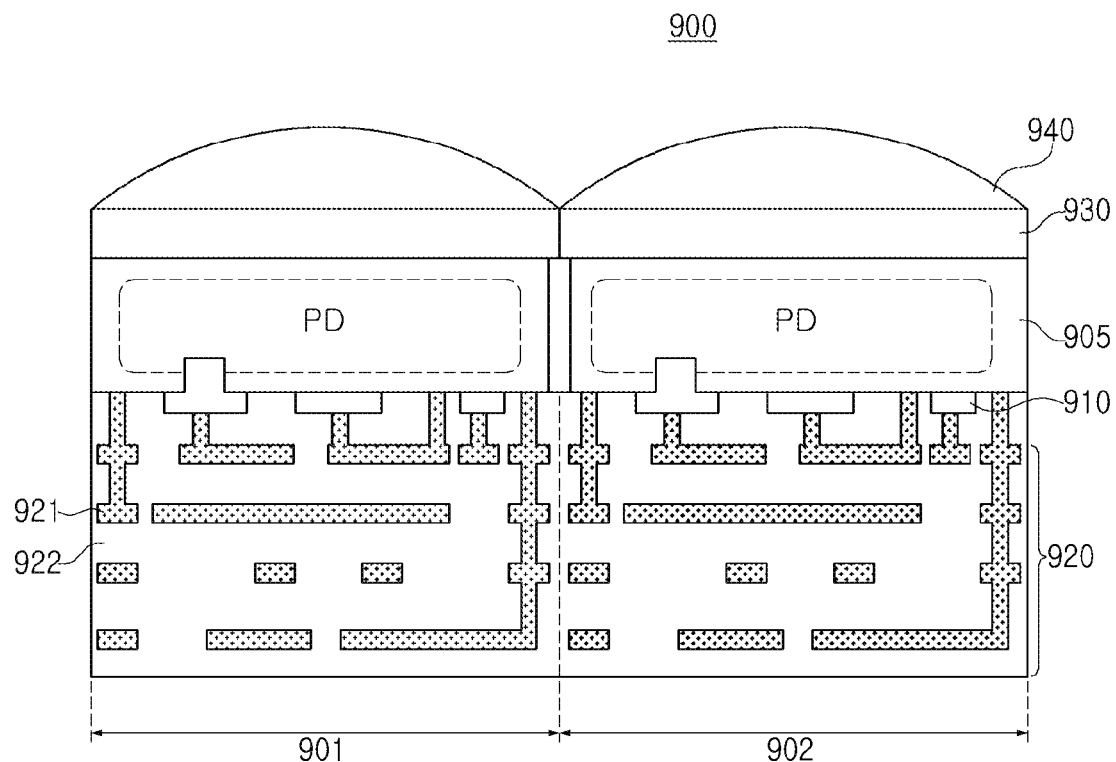
FIGS. 23 and 24 are schematic diagrams of image sensors according to example embodiments.
Figure 24:
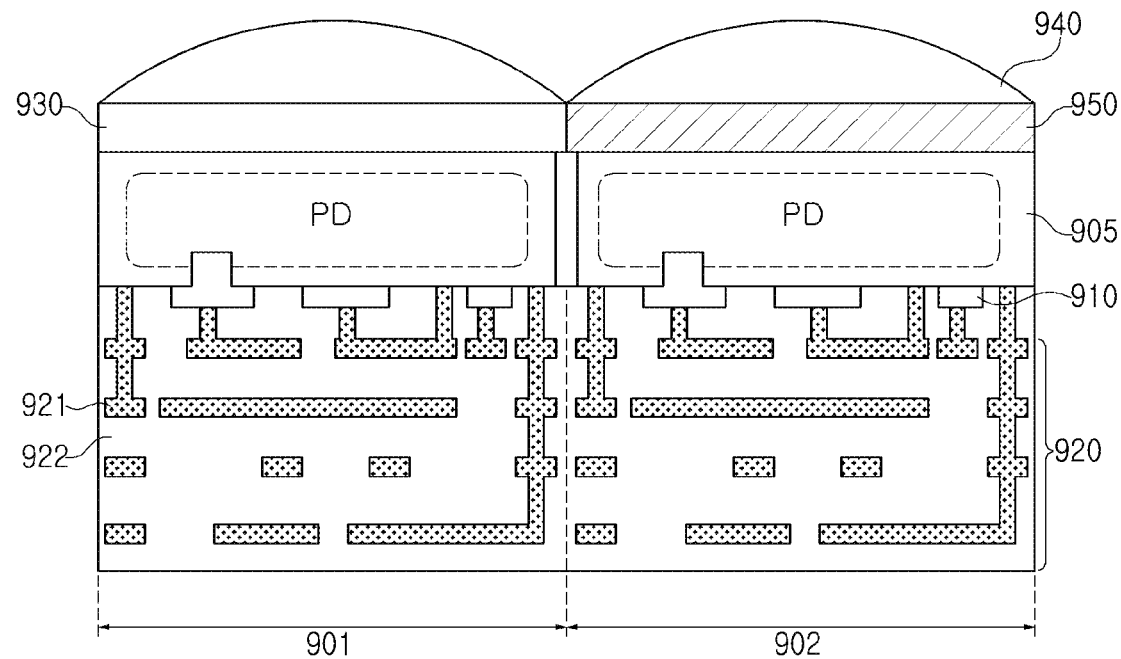

FIGS. 23 and 24 are schematic diagrams of image sensors according to some example embodiments.

FIGS. 23 and 24 may be schematic cross-sectional views of an active pixel 901 and an inactive pixel 902 included in the image sensors 900 and 900A according to some example embodiments. The active pixel 901 and the inactive pixel 902 may be adjacent to each other in a first direction (a Y-axis direction). Therefore, it will be understood that a column lines extend in the image sensors 900 and 900A in the first direction.

Referring to FIG. 23, an image sensor 900 may include a substrate 905 including a semiconductor material. A photodiode PD may be formed in the substrate 905 as a photoelectric element. According to some example embodiments, the photodiode PD may be replaced with another element generating charges in response to light.

A plurality of elements 910, electrically connected to the photodiode PD, may be formed on one surface of the substrate 905. The elements 910 may provide a pixel circuit and may include, for example, a transfer transistor, a reset transistor, a driving transistor, a selection transistor, and/or the like. As described above, inactive pixel 902 may further include a switch transistor which may electrically connect column lines to each other.

According to some example embodiments, the switch transistor may be disposed in a logic circuit, rather than an inactive pixel 902. However, even when the switch transistor is disposed in the logic circuit, the switch transistor may be connected to at least a portion of the elements 910, included in the inactive pixel 902, through a metal wiring 921. As an example, the switch transistor may be connected to a node between a driving transistor and a selection transistor, included in the inactive pixel 902, through the metal wiring 921.

The elements 910 may be connected to the metal wiring 921, and the elements 910 and the metal wiring 921 may be covered with an insulating layer 922. The metal wiring 921 and the insulating layer 922 may provide a wiring layer 920 disposed on one surface of the substrate 905. A color filter 930 and a microlens 940 may be disposed on the other surface of the substrate 905, opposing the one surface on which wiring layer 920 is disposed.

Referring to FIG. 24, instead of the color filter 930, a blocking layer 950 may be formed on one surface of the inactive pixel 902 in the image sensor 900A. Unlike the color filter 930 transmitting light in a specific wavelength band, the blocking layer 950 may block light. Therefore, light may not be incident on the photodiode PD included in the inactive pixel 902.

As described above, the transfer transistor connected between the photodiode PD and the floating diffusion region in the inactive pixel 902 may be maintained in a turned-off state during a readout operation in which a readout circuit obtains pixel data from the active pixel 901. Therefore, charges may be generated in the photodiode PD due to light incident on the inactive pixel 902. When charges are excessively generated, the charges may leak.

In example embodiments illustrated in FIG. 24, instead of the color filter 930, the blocking layer 950 may be disposed on one surface, on which light is incident, in the inactive pixel 902. The blocking layer 950 may reduce or prevent charges from being excessively generated in a photodiode PD of the inactive pixel 902 and to reduce or prevent leakage of the charges from occurring. Alternatively, as described in example embodiments illustrated in FIG. 23, the charges of the photodiode PD included in the inactive pixel 902 may be reset every predetermined or alternatively, desired period without the blocking layer 950.

Figure 25:
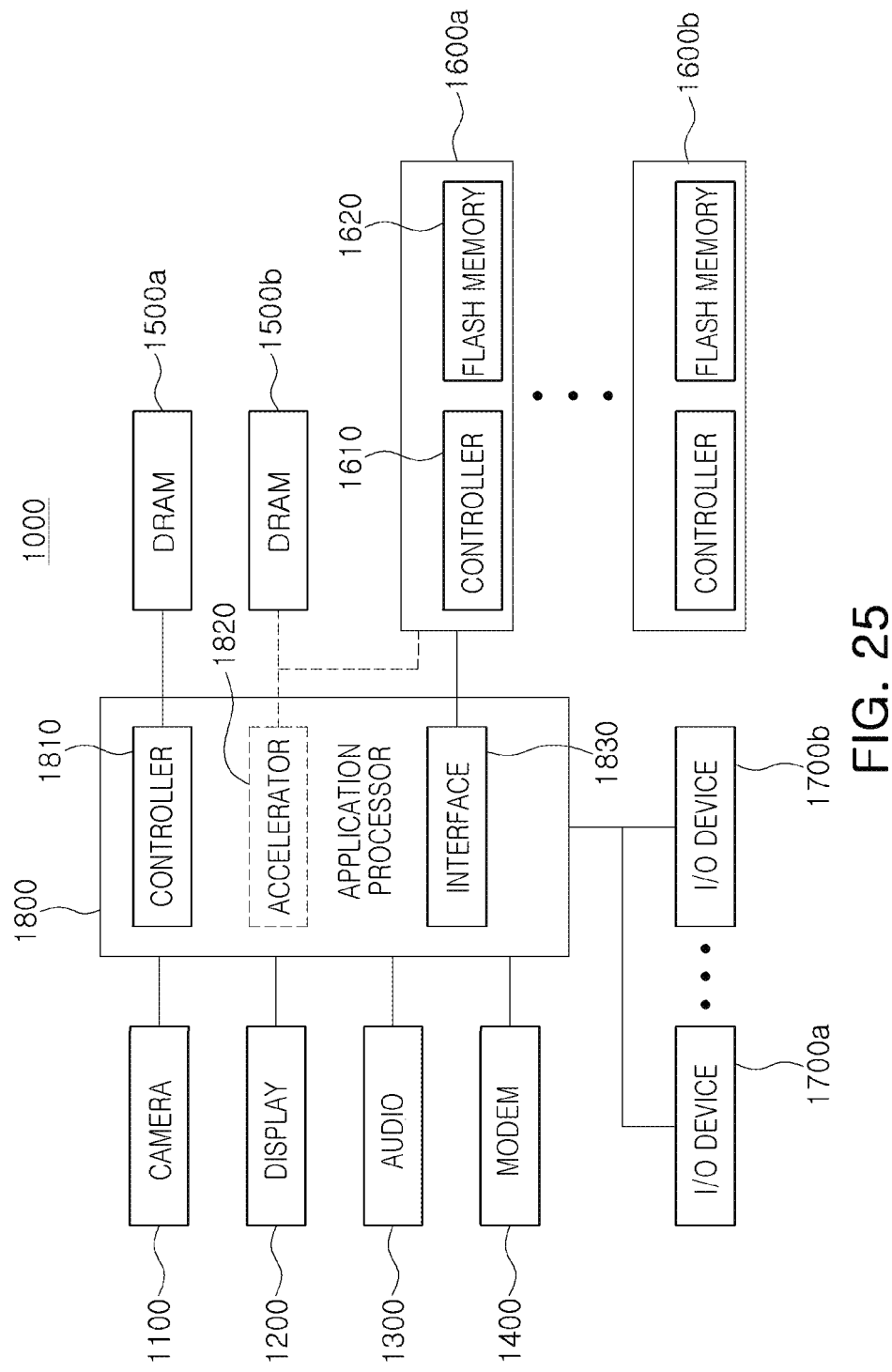
FIG. 25 is a schematic block diagram of a mobile system including an image sensor according to example embodiments.

FIG. 25 is a schematic block diagram of a mobile system including an image sensor according to some example embodiments.

Referring to FIG. 25, a mobile system 1000 may include a camera 1100, a display 1200, an audio processing unit 1300, a modem 1400, DRAMs 1500a and 1500b, flash memory devices 1600a and 1600b, input/output (I/O) devices 1700a and 1700b, and an application processor (hereinafter referred to as "AP") 1800.

The mobile system 1000 may be implemented as a laptop computer, a portable terminal, a smartphone, a tablet personal computer (table PC), a wearable device, a healthcare device, or an Internet-of-Things (IoT) device. Also, the mobile system 1000 may be implemented as a server or a PC.

The camera 1100 may capture a still image or a video under the user's control. The mobile system 1000 may obtain specific information using a still image/video captured by the camera 1100, or may convert and store the still image/video into other types of data such as text. Alternatively, the mobile system 1000 may recognize a character string included in the still image/video captured by the camera 1100, and may provide a text or audio translation corresponding to the character string. As described above, the camera 1100 in the mobile system 1000 tends to be used in various fields of application. In some example embodiments, the camera 1100 may transmit data, such as a still image/video, to the AP 1800 according to a D-PHY or C-PHY interface in the MIPI standard.

The camera 1100 may include an image sensor according to at least one of example embodiments described with reference to FIGS. 1 to 24. For example, the image sensor included in the camera 1100 may include active pixels, outputting pixel data during a readout operation, and inactive pixels electrically connecting or separating column lines to or from each other during at least a certain time of the readout operation. In some example embodiments, column lines may be electrically connected to each other during a time in which charges are transferred to a floating diffusion region from active pixels reading pixel data, and thus, voltage fluctuations occurring in the column lines may be significantly reduced and noise characteristics of the image sensor may be improved.

The display 1200 may be implemented in various forms such as a liquid crystal display (LCD), an organic light emitting diodes (OLED) display, an active-matrix organic light emitting diodes (AMOLED) display, a plasma display panel (PDP), a field emission display (FED), an electronic paper, and/or the like. In some example embodiments, the display 1200 may provide a touchscreen function to be also used as an input device of the mobile system 1000. In addition, the display 1200 may be integrated with a fingerprint sensor, or the like, to provide a security function of the mobile system 1000. In some example embodiments, the AP 1800 may transmit image data, to be displayed on the display 1200 according to the D-PHY or C-PHY interface in the MIPI standard, to the display 1200.

The audio processing unit 1300 may process audio data, stored in flash memory devices 1600a and 1600b, or audio data included in contents externally received through a modem 1400 or the I/O devices 1700a and 1700b. For example, the audio processing unit 1300 may perform various processes, such as coding/decoding, amplification, and noise filtering, or the like, on the audio data.

The modem 1400 may modulate a signal and transmit the modulated signal to transmit and receive wired/wireless data, and may demodulate an externally received signal to restore an original signal. The I/O devices 1700a and 1700b may provide digital input and output, and may include an input device, such as a port connectable to an external recording medium, a touchscreen, or a mechanical button key, and an output device, capable of outputting a vibration in a haptic manner. In certain examples, the I/O devices 1700a and 1700b may be connected to an external recording medium through a port such as a USB, a lightning cable, an SD card, a micro SD card, a DVD, a network adapter, or the like.

The AP 1800 may control the overall operation of the mobile system 1000. For example, the AP 1800 may control the display 1200 to display a portion of the contents, stored in the flash memory devices 1600a and 1600b, on a screen. When a user input is received through the I/O devices 1700a and 1700b, the AP 1800 may perform a control operation corresponding to the user input.

The AP 1800 may be provided as a system-on-chip (SoC) driving an application program, an operating system (OS), or the like. In addition, the AP 1800 may be included in a single semiconductor package together with other devices included in the mobile system 1000, for example, a DRAM 1500*a*, a flash memory 1620, and/or a memory controller 1610. For example, the AP 1800 and at least one device may be provided in a package form such as Package on Package (PoP), Ball grid arrays (BGAs), Chip scale packages (CSPs), System In Package (SIP), Multi Chip Package (MCP), Wafer-level Fabricated Package (WFP), Wafer—In the form of a package such as a Level Processed Stack Package (WSP). A kernel of the operating system, driven on the AP 1800, may include an input/output scheduler and a device driver for controlling the flash memory devices 1600*a* and 1600*b*. The device driver may control access performance of the flash memory devices 1600*a* and 1600*b* with reference to the number of synchronous queues managed by the input/output scheduler, or may control a CPU mode inside the SoC, a dynamic voltage and frequency scaling (DVFS) level, and/or the like.

In some example embodiments, the AP 1800 may include a processor block, executing an operation or driving an application program and/or an operating system, and various other peripheral elements connected through a system block and a system bus. The peripheral elements may include a memory controller, an internal memory, a power management block, an error detection block, a monitoring block, and/or the like. The processor block may include one or more cores. When a plurality of cores are included in the processor block, each of the cores includes a cache memory and a common cache, shared by the cores, may be included in the processor block.

In some an embodiments, the AP 1800 may include an accelerator block 1820, a specific-purpose circuit for AI data operation. Alternatively, according to example embodiments, a separate accelerator chip may be provided to be separated from the AP 1800, and a DRAM 1500*b* may be additionally connected to the accelerator block 1820 or an accelerator chip. The accelerator block 1820 may be a functional block specialized in performing specific functions of the AP 1800, and may include a graphics processing unit (GPU) serving as a functional block specialized in processing graphics data, a neural processing unit (NPU) serving as a functional block specialized in performing AI computation and interference, a data processing unit (DPU) serving as a functional block specialized in transmitting data, or the like.

According to example embodiments, the mobile system 1000 may include a plurality of DRAMs 1500*a* and 1500*b*. In some example embodiments, the AP 1800 may include a controller 1810 for controlling the DRAM 1500*a* and 1500*b*, and the DRAM 1500*a* may be directly connected to the AP 1800.

The AP 1800 may set a command and a mode register set (MRS) command according to the JEDEC standard to control a DRAM, or may set specifications and functions required by the mobile system 1000, such as a low voltage, high speed, and reliability, and a DRAM interface protocol for CRC/ECC to perform communication. For example, the AP 1800 may set a new DRAM interface protocol to control the DRAM 1500*b* for an accelerator, in which an accelerator block 1820 or an accelerator chip provided independently of the AP 1800 has a higher bandwidth than the DRAM 1500*a*, to perform communication.

Only the DRAMs 1500*a* and 1500*b* are illustrated in FIG. 25, but a configuration of the mobile system 1000 is not necessarily limited thereto. According to bandwidth and reaction speed of the AP 1800 and the accelerator block 1820 and voltage conditions, memories other than the DRAMS 1500*a* and 2500*b* may be included in the mobile system 1000. As an example, the controller 1810 and/or the accelerator block 1820 may control various memories such as PRAM, SRAM, MRAM, RRAM, FRAM, Hybrid RAM, and/or the like. The DRAMs 1500*a* and 2500*b* have relatively lower latency and higher bandwidth than input/output devices 1700*a* and 1700*b* or flash memory devices 1600*a* and 1600*b*. The DRAMs 1500*a* and 2500*b* may be initialized at a power-on point in time of the mobile system 1000. When an operating system and application data are loaded, the DRAMs 1500*a* and 2500*b* may be used as locations, in which the operating system and application data are temporarily stored, or as spaces in which various software codes are executed.

Four fundamental arithmetic operations such as addition, subtraction, multiplication, and division and a vector operation, an address operation, or FFT operation data may be stored in the DRAMs 1500*a* and 1500*b*. In another example embodiment, the DRAMs 1500*a* and 1500*b* may be provided as a processing in memory (PIM) having an operational function. For example, a function used to perform inference in the DRAMs 1500*a* and 1500*b* may be performed. For example, the inference may be performed in a deep learning algorithm using an artificial neural network. The deep learning algorithm may include a training step, in which a model is learned through various data, and an inference step in which data is recognized with the trained model. For example, a function used in the inference may include a hyperbolic tangent function, a sigmoid function, a rectified linear unit (ReLU) function, or the like.

As an example embodiment, an image captured by a user through the camera 1100 may be signal-processed and stored in the DRAM 1500*b*, and the accelerator block 1820 or the accelerator chip may an AI data operation using the data stored in the DRAM 1500*b* and the function used in the inference to recognize data.

According to some example embodiments, the mobile system 1000 may include a plurality of storage or a plurality of flash memory devices 1600*a* and 1600*b* having capacity higher than capacity of the DRAMs 1500*a* and 1500*b*. The flash memory devices 1600*a* and 1600*b* may include a controller 1610 and a flash memory 1620. The controller 1610 may receive a control command and data from the AP 1800, and may write data to the flash memory 1620 in response to the control command or may read data stored in the flash memory 1620 and transmit the read data to the AP 1800.

According to some example embodiments, the accelerator block 1820 or the accelerator chip may perform a training step and an AI data operation using the flash memory devices 1600*a* and 1600*b*. As an example embodiment, an operational logic, capable of performing a predetermined or alternatively, desired operation in the flash memory devices 1600*a* and 1600*b*, may be implemented in the controller 1610. Instead of the AP 1800 and/or the accelerator block 1820, the operational logic may perform at least a portion of the training step and the inference, performed by the AP 1800 and/or the accelerator block 1820, using the data stored in the flash memory 1620.

In some example embodiments, the AP 1800 may include an interface 1830. Accordingly, the flash memory devices 1600*a* and 1600*b* may be directly connected to the AP 1800. For example, the AP 1800 may be implemented as an SoC, the flash memory device 1600*a* may be implemented as a chip independently of the AP 1800, and the AP 1800 and the flash memory device 1600*a* may be mounted in a single package. However, example embodiments are not limited thereto, and the plurality of flash memory devices 1600a and 2600b may be electrically connected to the mobile system 1000 through a connection.

The flash memory devices 1600a and 2600b may stores data such as a still image/video, captured by the camera 1100, or data received through a communications network and/or a ports included in the input and output devices 1700a and 1700b. For example, the flash memory devices 1600a and 2600b may store augmented reality/virtual reality, high definition (HD) or ultra high definition (UHD) contents.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As described above, according to example embodiments, a pixel array may include active pixels and inactive pixels and may control a switch transistor, capable of connecting pixels circuits of the inactive pixels to each other, to electrically connect or separate column lines to or from each other. The switch transistor may be turned on during a predetermined or alternatively, desired time to electrically connect the column lines to each other. As a result, fluctuations of output voltages of the pixels, output through the column lines, may be significantly reduced and noise characteristics of an image sensor may be improved.

While example embodiments have been shown and described above, it will be apparent to those skilled in the art that modifications and variations could be made without departing from the scope of the present inventive concepts as defined by the appended claims.

What is claimed is:

1. An image sensor comprising:
   a substrate including an active pixel region and an inactive pixel region, having a smaller area than the active pixel region;
   a plurality of active pixels in the active pixel region, each of the plurality of active pixels including a first transfer transistor, a first reset transistor, a first driving transistor, and a first selection transistor; and
   a plurality of inactive pixels in the inactive pixel region, each of the plurality of inactive pixels including a second transfer transistor, a second reset transistor, a second driving transistor, a second selection transistor, and a switch transistor connected to a node between the second driving transistor and the second select transistor,
   wherein each of the plurality of switch transistors, included in the plurality of inactive pixels, are connected to each other by a connection wiring.

2. The image sensor of claim 1, further comprising:
   a plurality of row lines extending in a first direction and connected to the plurality of active pixels or the plurality of inactive pixels; and
   a plurality of column lines extending in a second direction, intersecting the first direction, and connected to the plurality of active pixels and the plurality of inactive pixels,
   wherein at least one of the plurality of inactive pixels and a portion of the plurality of active pixels are in the same position in the first direction and are commonly connected to one of the plurality of column lines.

3. The image sensor of claim 2, wherein the active pixel region and the inactive pixel region have the same width in the first direction.

4. The image sensor of claim 1, wherein each of the plurality of active pixels includes a first photoelectric element, and each of the plurality of inactive pixels includes a second photoelectric element, and
   a light receiving area of each of the plurality of first photoelectric elements is the same as a light receiving area of each of the plurality of second photoelectric elements.

5. The image sensor of claim 4, wherein each of the plurality of inactive pixels includes a blocking layer blocking each of the plurality of second photoelectric elements from light.

6. The image sensor of claim 1, wherein the inactive pixel region includes a plurality of inactive pixel regions, and the active pixel region is between the plurality of inactive pixel regions.

7. The image sensor of claim 6, wherein in each of the plurality of inactive pixel regions, the plurality of inactive pixels are in a first direction and are adjacent to at least one of the plurality of active pixels in a second direction, intersecting the first direction.

8. The image sensor of claim 7, wherein the plurality of inactive pixels are not adjacent to other of the plurality of inactive pixels.

9. The image sensor of claim 1, wherein a ratio of an area of the active pixel region to an area of the inactive pixel region is 100:1 to 5000:1.

10. The image sensor of claim 1, wherein in each of the plurality of inactive pixels, a gate of the corresponding switch transistor is connected to a gate of the corresponding second selection transistor.

11. An image sensor comprising:
    a plurality of active pixels in a first direction and a second direction, intersecting the first direction, the plurality of active pixels including a first selection transistor connected to one column line, among a plurality of column lines extending in the second direction;
    a plurality of inactive pixels in the first direction, the plurality of inactive pixels including a second selection transistor connected to one of the plurality of column lines;
    a plurality of switch transistors, each of the plurality of switch transistors connected to the corresponding second selection transistor, included in each of the plurality of inactive pixels, and a connection wiring extending in the first direction; and
    a logic circuit configured to obtain pixel data output by the plurality of active pixels and to turn on the plurality of switch transistors while the plurality of second selection transistors are turned on.

12. The image sensor of claim 11, wherein each of the plurality of active pixels includes a first photoelectric element, a first transfer transistor, a first reset transistor, and a first driving transistor, and
    each of the plurality of inactive pixels includes a second photoelectric element, a second transfer transistor, a second reset transistor, and a second driving transistor.

13. The image sensor of claim 12, wherein the logic circuit is configured to obtain a reset signal during a first time and is configured to obtain a pixel signal during a second time, subsequent to the first time, from selected pixels, among the plurality of active pixels, and the logic circuit is configured to turn on the first transfer transistors, included in the selected pixels, during a transfer time between the first time and the second time, and is configured to turn off the second selection transistors and the switch transistors, included in the selected pixels, during the transfer time.

14. The image sensor of claim 13, wherein a turned-on time of the first transfer transistors is shorter than a turned-on time of the second selection transistors and a turned-on time of the switch transistors.

15. The image sensor of claim 13, wherein the logic circuit is configured to turn off the second transistors during the transfer time.

16. The image sensor of claim 12, wherein each of the plurality of switch transistors is connected to a node between the corresponding second driving transistor and the corresponding second selection transistor.

17. The image sensor of claim 11, wherein a number of the plurality of active pixels is N times a number of the plurality of inactive pixels (where N is a positive integer).

18. An image sensor comprising:
a plurality of pixels connected to a plurality of row lines, extending in a first direction, and a plurality of column lines extending a second direction, intersecting the first direction; and
a logic circuit configured to obtain pixel data from the plurality of pixels,
wherein each of the plurality of pixels includes a photoelectric element, a floating diffusion region in which charges generated by the photoelectric element are stored, a transfer transistor between the floating diffusion region and the photoelectric element, a driving transistor connected to the floating diffusion region, and a selection transistor connected between one of the column lines and the driving transistor, and
the logic circuit is configured to obtain a reset signal from selected pixels, among the plurality of pixels, during a first time, is configured to obtain a pixel signal from the selected pixels during a second time, subsequent to the first time, and is configured to electrically connect the plurality of column lines to each other and is configured to turn on the transfer transistor of each of the selected pixels during a transfer time between the first time and the second time.

19. The image sensor of claim 18, wherein the logic circuit is configured to electrically separate the plurality of column lines from each other during the first time and the second time.

20. The image sensor of claim 18, wherein the plurality of pixels includes a plurality of active pixels and a plurality of inactive pixels, and
the logic circuit is configured to maintain the transfer transistor of each of the inactive pixels in a turned-off state while configured to obtain the reset signal and the pixel signal from each of the active pixels.

* * * * *